United States Patent
Chou

(10) Patent No.: US 11,854,754 B2
(45) Date of Patent: Dec. 26, 2023

(54) SENSOR SWITCH

(71) Applicant: Tien-Ming Chou, Taichung (TW)

(72) Inventor: Tien-Ming Chou, Taichung (TW)

( * ) Notice: Subject to any disclaimer, the term of this patent is extended or adjusted under 35 U.S.C. 154(b) by 652 days.

(21) Appl. No.: 17/087,061

(22) Filed: Nov. 2, 2020

(65) Prior Publication Data

US 2021/0327668 A1 Oct. 21, 2021

(30) Foreign Application Priority Data

Apr. 17, 2020 (TW) ................. 109113064

(51) Int. Cl.
*H01H 35/02* (2006.01)
*G01D 5/26* (2006.01)
*H03K 17/965* (2006.01)

(52) U.S. Cl.
CPC ............ *H01H 35/02* (2013.01); *G01D 5/26* (2013.01); *H03K 17/965* (2013.01)

(58) Field of Classification Search
CPC ......... H01H 35/02; G01D 5/26; H03K 17/965
USPC ....................................... 398/151
See application file for complete search history.

(56) References Cited

U.S. PATENT DOCUMENTS

| | | | | |
|---|---|---|---|---|
| 6,611,635 | B1* | 8/2003 | Yoshimura | H01L 24/96 257/E25.032 |
| 6,690,845 | B1* | 2/2004 | Yoshimura | G02B 6/124 257/E25.032 |
| 2012/0145888 | A1* | 6/2012 | Chou | G01D 5/342 250/230 |
| 2013/0001053 | A1* | 1/2013 | Li | H01H 35/02 200/61.52 |
| 2014/0231629 | A1* | 8/2014 | Chou | G01C 9/10 250/214 SW |
| 2014/0262704 | A1* | 9/2014 | Chou | H01H 35/02 200/61.52 |
| 2021/0304990 | A1* | 9/2021 | Chou | H01H 1/5805 |
| 2021/0327668 | A1* | 10/2021 | Chou | H01H 35/02 |
| 2023/0028369 | A1* | 1/2023 | Chou | H01H 35/02 |

OTHER PUBLICATIONS

Matsuda et al; Liquid-Based Digital Readable Tilt Sensor; 2021; Adv. Mater. Technology; pp. 1-9. (Year: 2021).*

* cited by examiner

*Primary Examiner* — Amritbir K Sandhu

(57) ABSTRACT

A sensor switch includes abase unit having bottom, top and intermediate layer assemblies cooperatively defining a receiving space. One of the bottom, top and intermediate layer assemblies has a mounting surface. A sensor unit is disposed in the receiving space and includes a light emitter, a light receiver, and a rolling member for changing the amount of light received by the light receiver. A conducting unit includes a power supply section, a power supply conducting element disposed on the mounting surface, and a signal conducting element disposed on the mounting surface and spaced apart from the power supply conducting element.

15 Claims, 19 Drawing Sheets

SENSOR SWITCH

CROSS REFERENCE TO RELATED APPLICATION

This application claims priority of Taiwanese Patent Application Number 109113064, filed on Apr. 17, 2020.

FIELD

The disclosure relates to a switch device, more particularly to a sensor switch.

BACKGROUND

An existing sensor switch includes a housing, a cover covering the housing and cooperating with the same to define a receiving space, and a light emitter, a light receiver and a ball all disposed in the receiving space. The receiving space includes an emitting area for mounting of the light emitter, a receiving area opposite to the emitting area for mounting of the light receiver, and a rolling area between the emitting area and the receiving area for rollably receiving the ball.

When the ball receives an external force, the ball rolls within the rolling area to block or open a light path between the light emitter and the light receiver to form an open or closed circuit. However, the volume of the existing sensor switch is large, so that the volume of the applied product will be limited. Further, assembling and wiring operations during manufacture of the existing sensor switch are complicated.

SUMMARY

Therefore, an object of the present disclosure is to provide a sensor switch that can alleviate at least one of the drawbacks of the prior art.

According to this disclosure, a sensor switch suitable for connection with a circuit board comprises a base unit, a sensor unit, and a conducting unit. The base unit is made from a plurality of raw ceramic blanks that are sintered after being stacked, and includes a bottom layer assembly, a top layer assembly opposite to the bottom layer assembly in a top-bottom direction, and an intermediate layer assembly connected between the bottom layer assembly and the top layer assembly and cooperating with the same to define a receiving space. One of the bottom layer assembly, the top layer assembly, and the intermediate layer assembly has a first mounting surface located on an outer side thereof and distal to the receiving space.

The sensor unit is disposed in the receiving space and includes a light emitter configured to emit light, a light receiver configured to receive the light emitted from the light emitter and then to generate a signal, and a rolling member located between the light emitter and the light receiver for changing the amount of light received by the light receiver.

The conducting unit is made of metal, is disposed on the base unit, and includes a power supply section, a power supply conducting element, a signal section, and a first signal conducting element. The power supply section is electrically connected to the light emitter and the light receiver. The power supply conducting element includes a first power supply conducting portion disposed on and abutting against the first mounting surface. The signal section is capable of transmitting the signal sent from the light receiver to the circuit board. The first signal conducting element includes a first signal conducting portion disposed on and abutting against the first mounting surface and spaced apart from the first power supply conducting portion.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
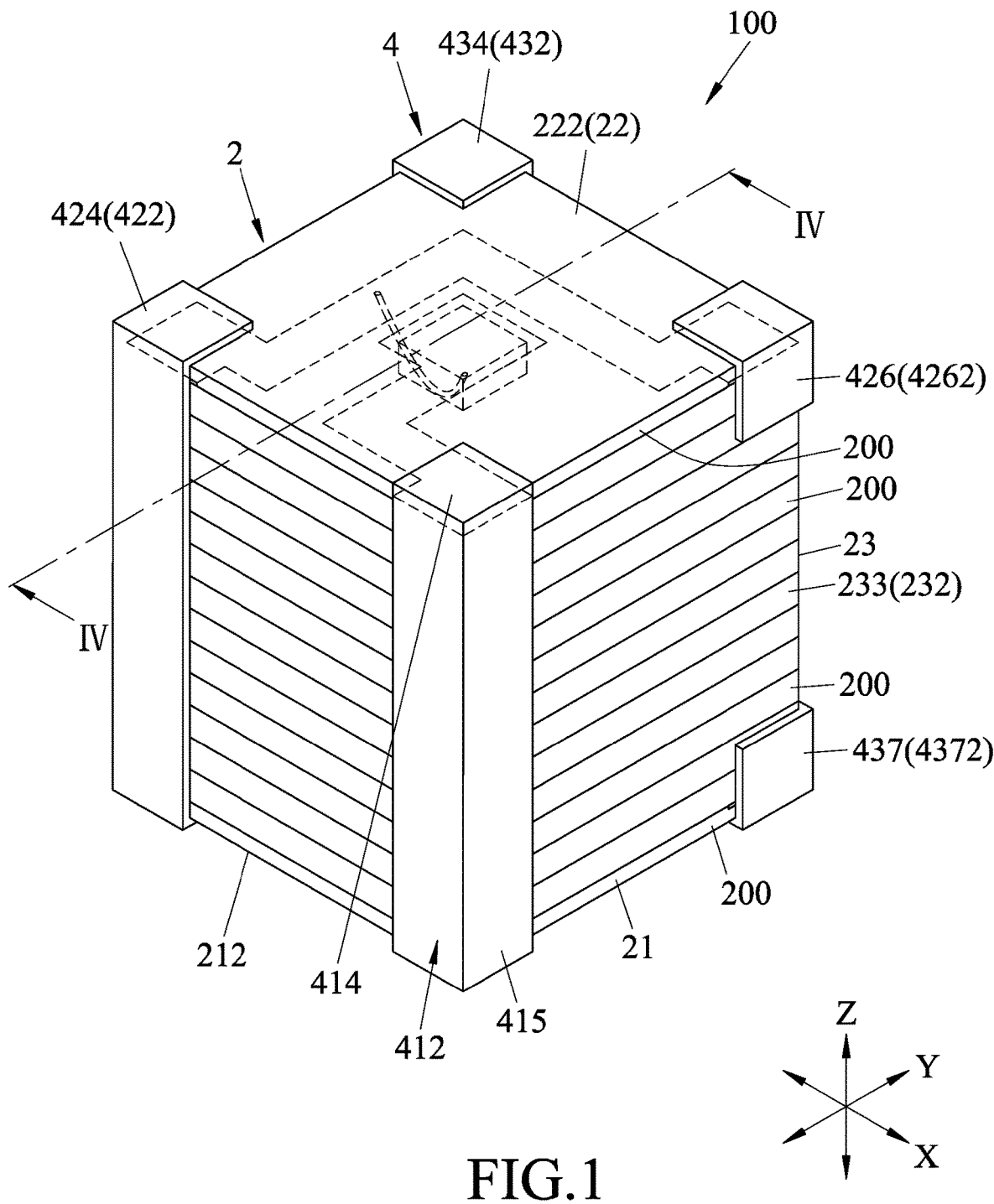
FIG. 1 is a perspective view of a sensor switch according to the first embodiment of the present disclosure.
Figure 2:
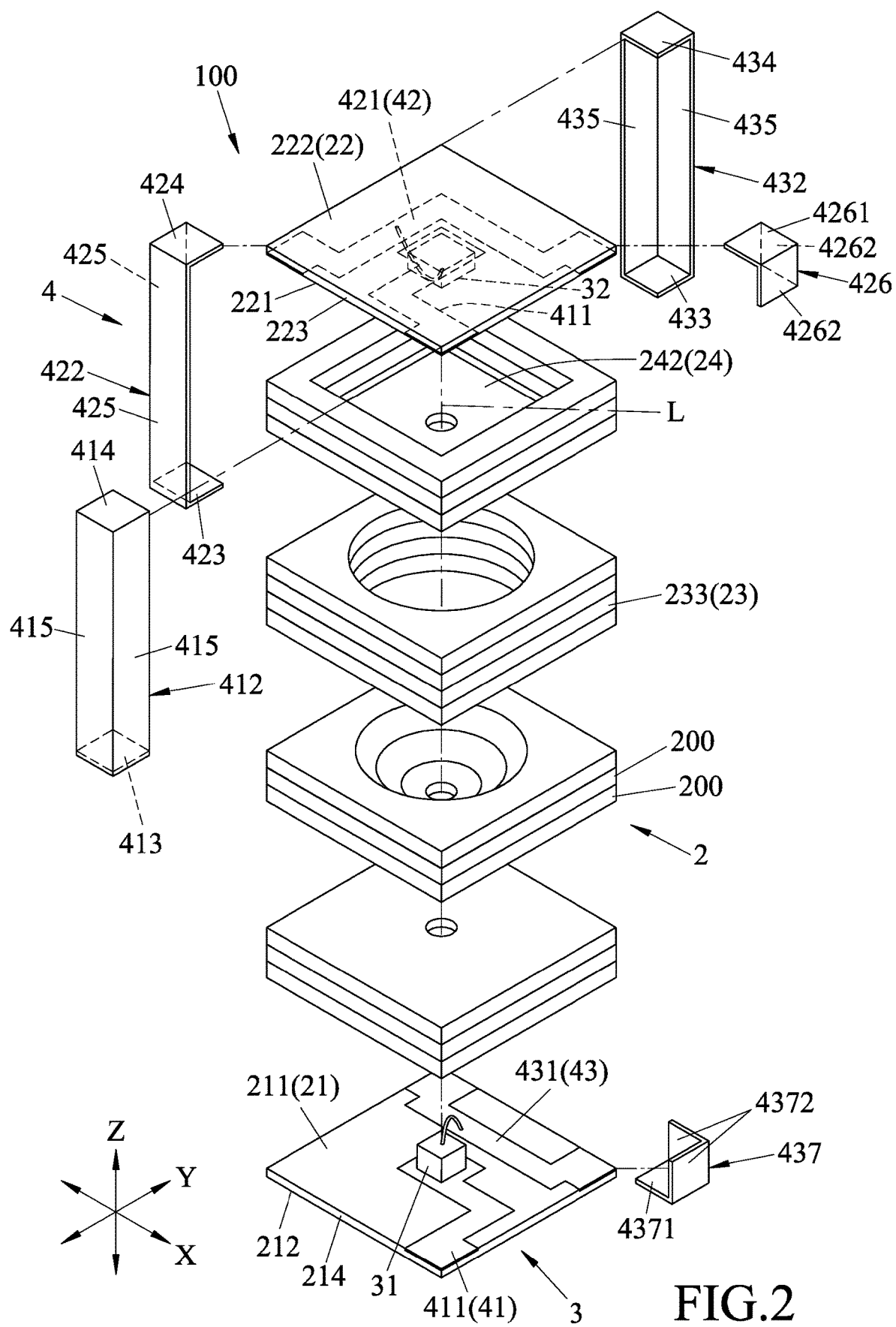
FIG. 2 is an exploded perspective view of the first embodiment.
Figure 3:
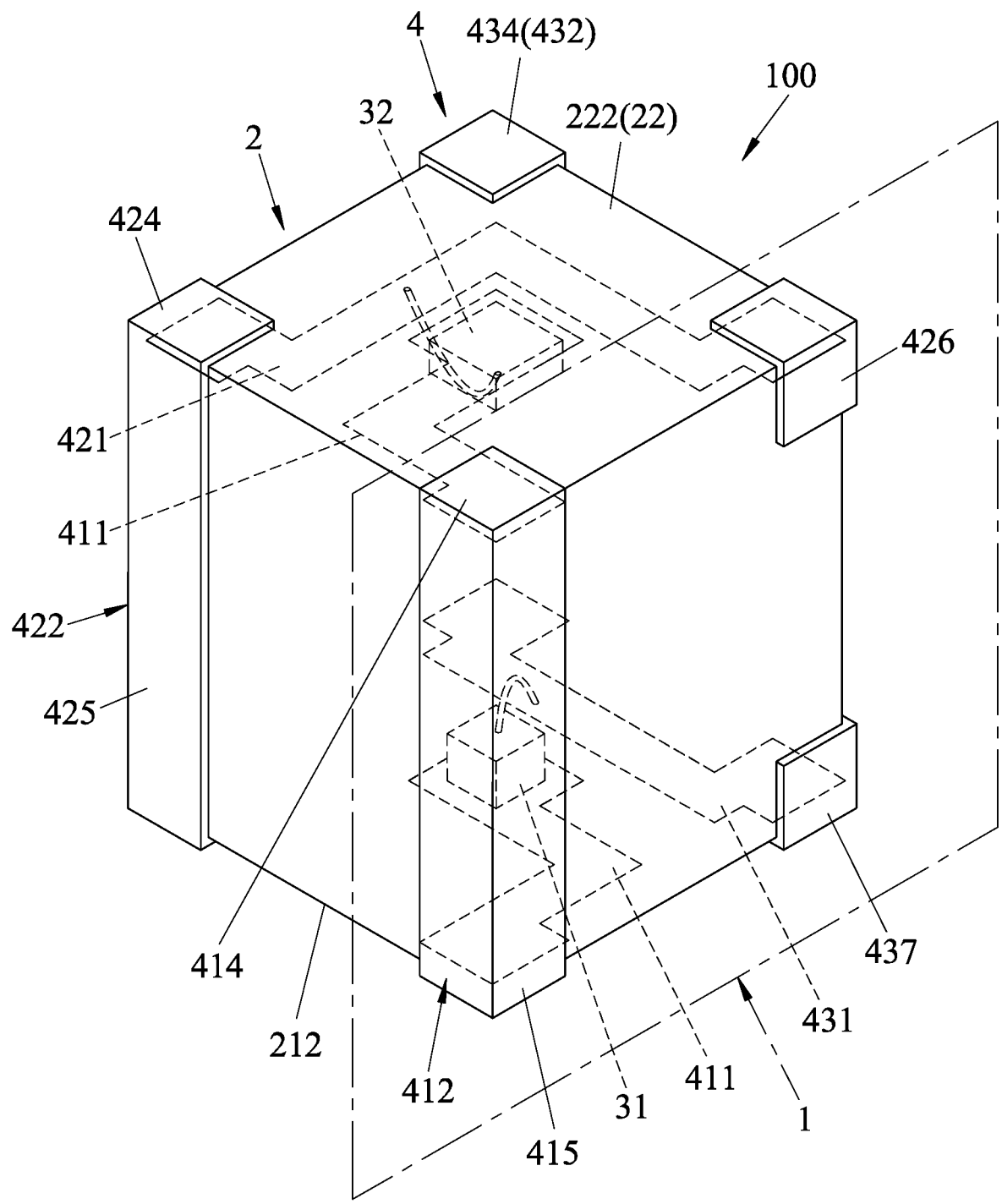
FIG. 3 is a transparent perspective view of the first embodiment.

Before the present disclosure is described in greater detail with reference to the accompanying embodiments, it should be noted herein that like elements are denoted by the same reference numerals throughout the disclosure.

Referring to FIGS. 1 to 4, a sensor switch 100 according to the first embodiment of the present disclosure is suitable for connection with a circuit board 1, and includes a base unit 2, a sensor unit 3, and a conducting unit 4.

The base unit 2 is made from a plurality of raw ceramic blanks 200 that are sintered after being stacked, and includes a bottom layer assembly 21, a top layer assembly 22 opposite to the bottom layer assembly 21 in a top-bottom direction (Z), and an intermediate layer assembly 23 connected between the bottom layer assembly 21 and the top layer assembly 22. The bottom layer assembly 21, the intermediate layer assembly 23 and the top layer assembly 22 cooperatively define a receiving space 24. In this embodiment, each of the bottom and top layer assemblies 21, 22 includes only one raw ceramic blank 200, and the intermediate layer assembly 23 includes thirteen raw ceramic blanks 200, but are not limited thereto. Each raw ceramic blank 200 is made of inorganic ceramics. It should be noted herein that the raw ceramic blanks 200 of the intermediate layer assembly 23 will be integrated as one body after sintering. To clearly disclose the layer structure of the intermediate layer assembly 23, all drawings in the disclosure only indicate the raw ceramic blanks 200.

The bottom layer assembly 21 has a bottom layer connecting surface 211, a first mounting surface 212 that is located on an outer side thereof, that is distal to the receiving space 24 and that is opposite to the bottom layer connecting surface 211 in the top-bottom direction (Z), and a bottom layer outer surrounding surface 214 interconnecting peripheries of the bottom layer connecting surface 211 and the first mounting surface 212.

The top layer assembly 22 has a top layer connecting surface 221, a second mounting surface 222 that is located on an outer side thereof, that is distal to the receiving space 24 and that is opposite to the top layer connecting surface 221 in the top-bottom direction (Z), and a top layer outer surrounding surface 223 interconnecting peripheries of the top layer connecting surface 221 and the second mounting surface 222.

The intermediate layer assembly 23 has a lower inner wall surface 2311, an upper inner wall surface 2312 opposite to the lower inner wall surface 2311 in the top-bottom direction (Z), a middle inner wall surface 2313 between the lower and upper inner wall surfaces 2311, 2312, and an intermediate layer outer surrounding surface 232 that surrounds the lower inner wall surface 2311, the upper inner wall surface 2312 and the middle inner wall surface 2313 and that serves as a third mounting surface 233. The bottom layer assembly 21 is connected to a bottom side of the intermediate layer assembly 23 using an adhesive material, while the top layer assembly 22 is connected to a top side of the intermediate layer assembly 23 using also an adhesive material.

The receiving space 24 has an emitting area 241 defined by the lower wall surface 2311, a receiving area 242 defined by the upper wall surface 2312, and a rolling area 243 that is defined by the middle wall surface 2313 and that is disposed between and communicates with the emitting area 241 and the receiving area 242. In this embodiment, the emitting area 241 is adjacent to the bottom layer assembly 21, and the receiving area 242 is adjacent to the top layer assembly 22, and the rolling area 243 has a conical shape that tapers in a top to bottom direction.

The sensor unit 3 includes a light emitter 31 disposed in the emitting area 241 and configured to emit light in an emission axis (L), a light receiver 32 disposed in the receiving area 242 and configured to receive the light emitted from the light emitter 31 and then to generate a signal, and a rolling member 33 rollably disposed in the rolling area 243 and located between the light emitter 31 and the light receiver 32 for changing the amount of light received by the light receiver 32. The light emitter 31 and the light receiver 32 are opposite to each other in the emission axis (L). In this embodiment, the emission axis (L) is parallel to the top-bottom direction (Z), and the rolling member 33 is a ball.

The rolling member 33 is made of an opaque material, and is rollable between an open circuit position and a closed circuit position. In the open circuit position, the rolling member 33 is at a position corresponding to the emission axis (L), and blocks the light receiver 32 from receiving the light emitted from the light emitter 31, as shown in solid line in FIG. 4. In the closed circuit position, the rolling member 33 deviates from the emission axis (L) to permit the light receiver 32 to receive the light emitted from the light emitter 31, as shown in imaginary line in FIG. 4.

The conducting unit 4 is made of metal, is disposed on the base unit 2, and includes a power supply section 41, a power supply conducting element 412, a signal section 42, a first signal conducting element 422, a second signal conducting element 426, a ground section 43, a first ground conducting element 432, and a second ground conducting element 437.

The power supply section 41 has two power supply connecting portions 411 that are made of metal, that are respectively disposed on the bottom layer connecting surface 211 and the top layer connecting surface 221, and that are connected electrically and respectively to the light emitter 31 and the light receiver 32.

The power supply conducting element 412 includes a first power supply conducting portion 413 disposed on and abutting against the first mounting surface 212, a second power supply conducting portion 414 disposed on and abutting against the second mounting surface 222, and two third power supply conducting portions 415 perpendicularly connected to each other. The third power supply conducting portions 415 have top ends respectively connected to two adjacent lateral ends of the second power supply conducting portion 414, and bottom ends respectively connected to two adjacent lateral ends of the first power supply conducting portion 413 such that the power supply conducting element 412 has an elongated cubic shape. The third power supply conducting portions 415 contact and abut against edges of the power supply connecting portions 411 that are respectively exposed on the bottom layer outer surrounding surface 214 and the top layer outer surrounding surface 223.

The signal section 42 has a signal connecting portion 421 that is made of metal, that is disposed on the top layer connecting surface 221, and that is wire bonded to the light receiver 32. The signal section 42 is capable of transmitting the signal sent from the light receiver 32 to the circuit board 1.

The first signal conducting element 422 is similar to the power supply conducting element 412 in structure, and includes a first signal conducting portion 423 disposed on and abutting against the first mounting surface 212, a second signal conducting portion 424 disposed on and abutting against the second mounting surface 222 and spaced apart from the second power supply conducting portion 414, and two third signal conducting portions 425 perpendicularly connected to each other. The third signal conducting portions 425 have top ends respectively connected to two adjacent lateral ends of the second signal conducting portion 424, and bottom ends respectively connected to two adjacent lateral ends of the first signal conducting portion 423 such that the first signal conducting element 422 has an elongated cubic shape. The third signal conducting portions 425 contact and abut against an edge of the signal connecting portion 421 exposed on the top layer outer surrounding surface 223. The first signal conducting element 422 is opposite to the power supply conducting element 412 in a left-right direction (X) transverse to the top-bottom direction (Z).

The second signal conducting element 426 has a mounting portion 4261 mounted on and abutting against the second mounting surface 222, and two side portions 4262 perpendicularly connected to each other and having top ends respectively connected to two adjacent lateral ends of the mounting portion 4261 such that the second signal conducting element 426 has a cubic shape. The side portions 4262 contact and abut against another edge of the signal connecting portion 421 exposed on the top layer outer surrounding surface 223. The second signal conducting element 426 is diagonally opposite to the first signal conducting element 422, and is spaced apart from the power supply conducting element 412 in a front-rear direction (Y) transverse to the top-bottom direction (Z) and the left-right direction (X). One of the side portions 4262 is disposed on and abuts against the third mounting surface 233.

The ground section 43 has a ground connecting portion 431 that is made of metal, that is disposed on the bottom layer connecting surface 211, and that is wire bonded to the light emitter 31.

The first ground conducting element 432 is similar to the power supply conducting element 412 in structure, and includes a first ground conducting portion 433 disposed on and abutting against the first mounting surface 212, a second ground conducting portion 434 disposed on and abutting against the second mounting surface 222, and two third ground conducting portions 435 perpendicularly connected to each other. The third ground conducting portions 435 have top ends respectively connected to two adjacent lateral ends of the second ground conducting portion 434, and bottom ends respectively connected to two adjacent lateral ends of the first ground conducting portion 433 such that the first ground conducting element 432 has an elongated cubic shape. The third ground conducting portions 435 contact and abut against an edge of the ground connecting portion 431 exposed on the bottom layer outer surrounding surface 214. The first ground conducting element 432 is spaced apart from the first signal conducting element 422 in the front-rear direction (Y), and is spaced apart from the second signal conducting element 426 in the left-right direction (X).

The second ground conducting element 437 is similar to the second signal conducting element 426 in structure, and has a mounting portion 4371 mounted on and abutting against the first mounting surface 212, and two side portions 4372 perpendicularly connected to each other and having bottom ends respectively connected to two adjacent lateral ends of the mounting portion 4371 such that the second ground conducting element 437 has a cubic shape. The side portions 4372 contact and abut against an opposite edge of the ground connecting portion 431 exposed on the bottom layer outer surrounding surface 214. The second ground conducting element 437 is spaced apart from the power supply conducting element 412 in the front-rear direction (Y), is spaced apart from the first ground conducting element 432 in the left-right direction (X), and is spaced apart from the second signal conducting element 426 in the top-bottom direction (Z). One of the side portions 4372 is disposed on and abuts against the third mounting surface 233.

It should be noted herein that the power supply conducting element 412, the first signal conducting element 422, the second signal conducting element 426, the first ground conducting element 432 and the second ground conducting element 437 are positioned on the corresponding corners of the base unit 2.

A manufacturing process of the sensor switch 100 of this disclosure involves the following steps:

Step 1: forming corresponding holes in the raw ceramic blanks 200 by machining, and disposing metal materials (such as silver, copper, gold, etc.) on the raw ceramic blanks 200 at positions corresponding to the power supply connecting portions 411, the signal connecting portion 421 and the ground connecting portion 431, the technological method of disposing the metal materials on the raw ceramic blanks 200 may include applying conductive adhesive to a stencil, a steel plate, or ink jet, or electroplating, chemical plating, sputtering, or using two of the above mentioned methods;

Step 2: stacking the raw ceramic blanks 200 one above the other, and applying equal pressure on the stacked raw ceramic blanks 200 to achieve a compact arrangement;

Step 3: cutting the compact stacked raw ceramic blanks 200 to a desired size;

Step 4: disposing metal materials (such as gold, alloy, etc.) on surfaces of the power supply connecting portions 411, the signal connecting portion 421 and the ground connecting portion 431 by electroplating, sputtering or coating according to the requirement;

Step 5: using a slow heating rate to increase the ambient temperature so as to burn and crack the polymer additives added to the raw ceramic blanks 200 during pulping, then the temperature is raised to densify the raw ceramic blanks 200 to remove holes, and sintering the raw ceramic blanks 200 to form the intermediate layer assembly 23 into two portions;

Step 6: adhering together the two portions of the intermediate layer assembly 23 after the rolling member 33 is placed therebetween, placing the light emitter 31 and the light receiver 32 respectively on the bottom layer assembly 21 and the top layer assembly 22, respectively wire bonding the light emitter 31 and the light receiver 32 to the ground connecting portion 431 and the signal connecting portion 421, and then coating adhesive materials (such as resin, glass, etc.) on a junction of the top layer assembly 22 and a top side of the intermediate layer assembly 23 and a junction of the bottom layer assembly 21 and a bottom side of of the intermediate layer assembly 23, after which the top layer assembly 22, the bottom layer assembly 21 and the intermediate layer assembly 23 are pressed and adhered together to form the base unit 2; and Step 7: disposing metal materials (such as silver, copper, gold, etc.) by electroplating, sputtering or coating on corresponding positions of the base unit 2 to form the power supply conducting element 412, the first signal conducting element 422, the second signal conducting element 426, the first ground conducting element 432 and the second ground conducting element 437, and raising the ambient temperature to densify the power supply conducting element 412, the first signal conducting element 422, the second signal conducting element 426, the first ground conducting element 432 and the second ground conducting element 437, so that the power supply conducting element 412, the first signal conducting element 422, the second signal conducting element 426, the first ground conducting element 432 and the second ground conducting element 437 connected to corresponding corners of the base unit 2 have good conductivity.

Through the aforesaid Steps 1 to 7, the sensor switch 100 can be completed.

With reference to FIGS. 1 to 4, in use, when the circuit board 1 is disposed on the first mounting surface 212, the power supply conducting portion 413, the signal conducting portion 423, the ground conducting portion 433, and the mounting portion 4371 of the second ground conducting element 437 are electrically connected to the circuit board 1. When the circuit board 1 is disposed on the second mounting surface 222, the power supply conducting portion 414, the signal conducting portion 424, the ground conducting portion 434, and the mounting portion 4261 of the second signal conducting element 426 are electrically connected to the circuit board 1. When the circuit board 1 is disposed on the third mounting surface 233, one of the third power supply conducting portions 415, one of the side portions 4262 of the second signal conducting element 426, and one of the side portions 4372 of the the second ground conducting element 437 are electrically connected to the circuit board 1.

Since the rolling member 33 is freely rollable in the rolling area 243, when the sensor switch 100 is tilted, the rolling member 33 will roll by gravity within the rolling area 243 between the open circuit position and the closed circuit position to change the amount of light received by the light receiver 32 and to control the signal generated by the light receiver 32.

Figure 4:
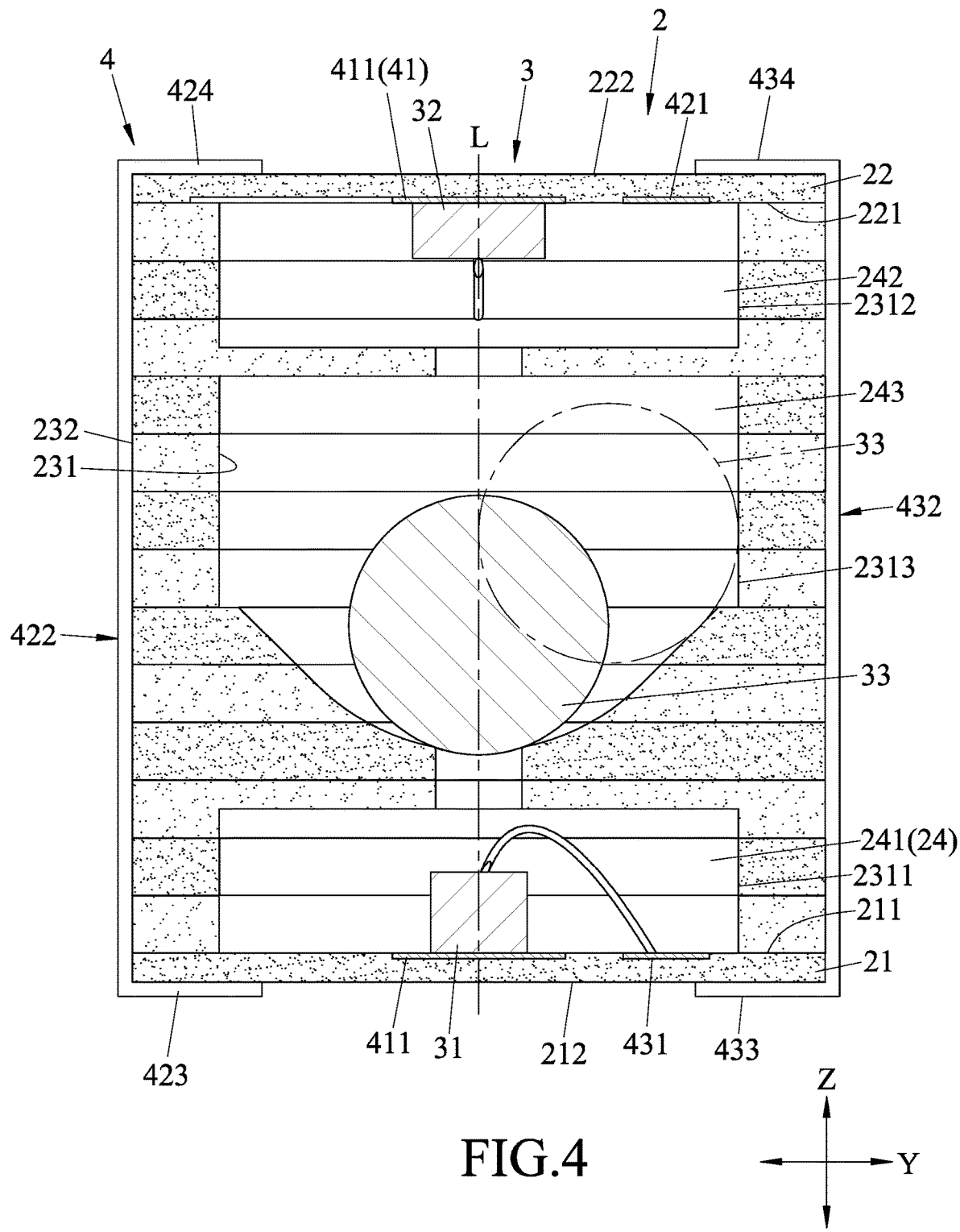
FIG. 4 is a sectional view of the first embodiment taken along line IV-IV of FIG. 1.
Figure 5:
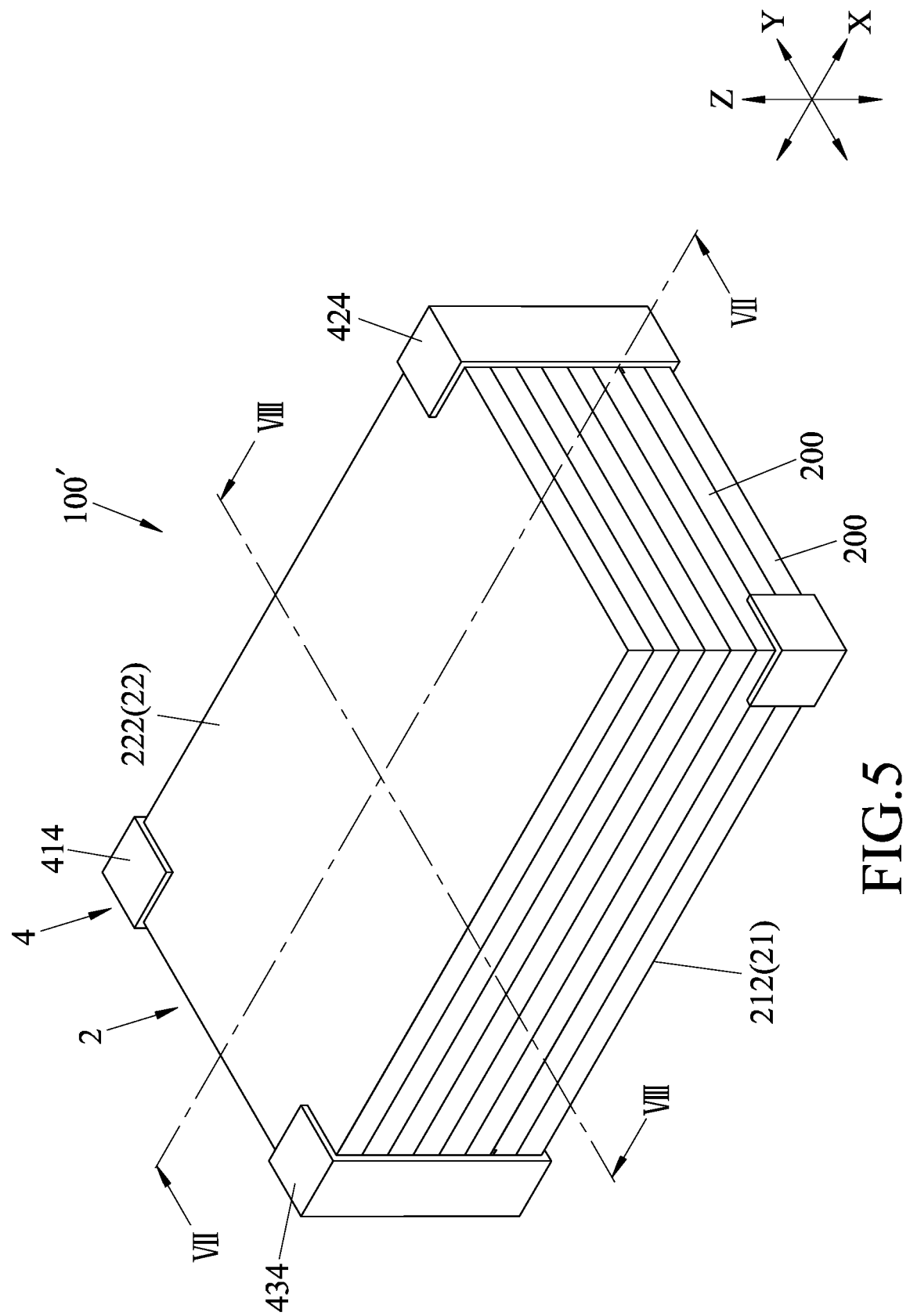
FIG. 5 is a perspective view of a sensor switch according to the second embodiment of the present disclosure.
Figure 6:
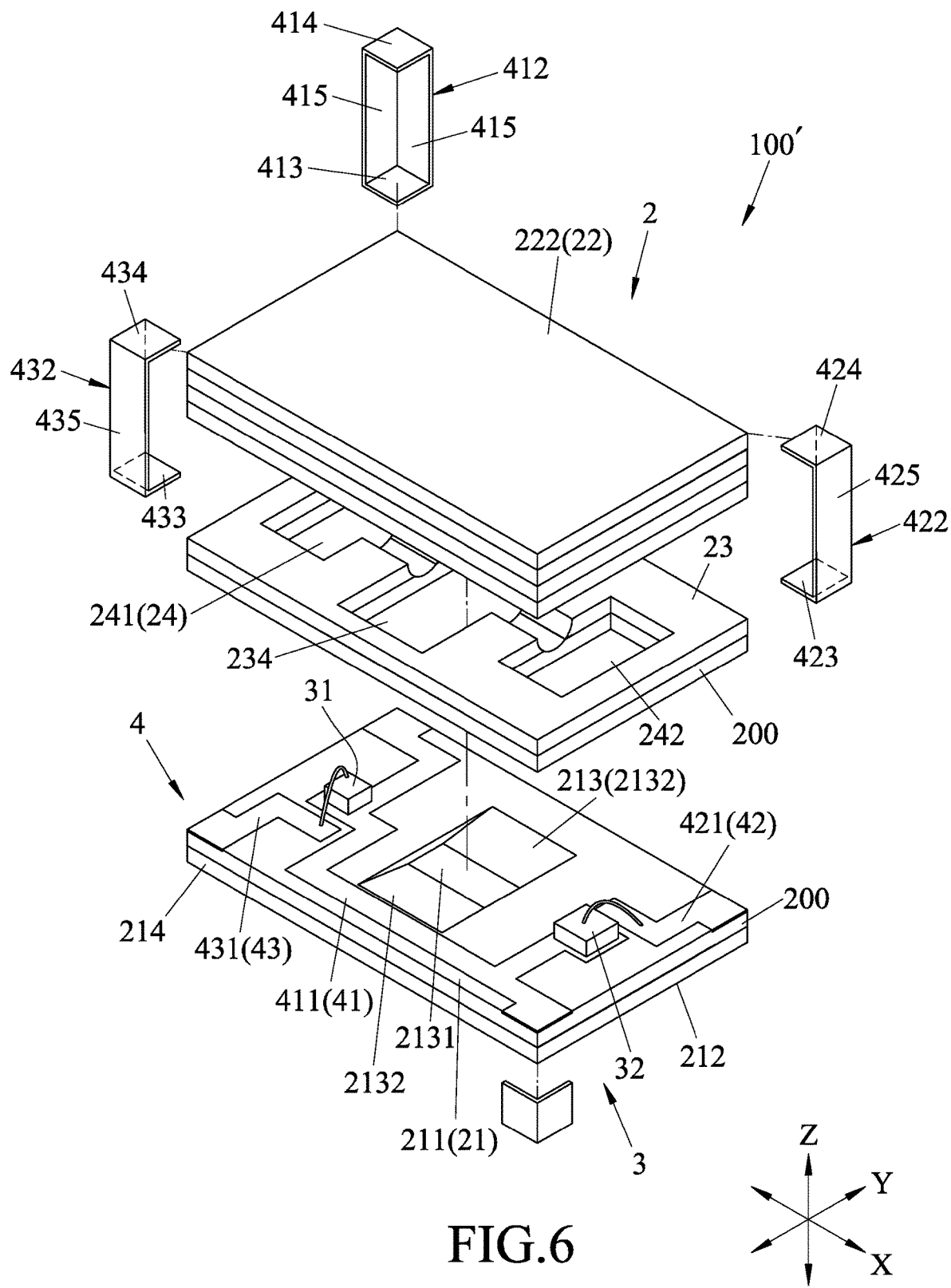
FIG. 6 is an exploded perspective view of the second embodiment.

For example, when the sensor switch 100 is horizontal, the rolling member 33 will roll to the open circuit position and block the light receiver 32 from receiving the light emitted from the light emitter 31, as shown in solid line in FIG. 4. When the sensor switch 100 is tilted to the right, the rolling member 33 is rolled toward the right side of the rolling area 243, as shown in imaginary line in FIG. 4, to permit the light receiver 32 to receive the light emitted from the light emitter 31, thereby shifting the sensor switch 100 from the open circuit position to the closed circuit position.

Since the light receiver 32 can generate a signal according to the received light, whether the sensor switch 100 is horizontal or tilted can be determined through the different signals generated by the light receiver 32 to perform a power-off protection or to send out an alarm. Therefore, the sensor switch 100 can be used as an omnidirectional angle switch.

By sintering the raw ceramic blanks 200 to make the base unit 2 of the sensor switch 100, and by using the method of stencil, steel plate, inkjet, electroplating, chemical plating or sputtering to form the power supply connecting portions 411, the signal connecting portion 421 and the ground connecting portion 431, the volume of the sensor switch 100 can be effectively reduced, so that the sensor switch 100 can be applied to smaller products, and the steps of assembly and wiring thereof can be simplified.

Referring to FIGS. 5 to 8, the second embodiment of the sensor switch 100' according to this disclosure is shown to be similar to the first embodiment. However, in the second embodiment, the emission axis (L) is parallel to the left-right direction (X), the bottom layer assembly 21 includes two raw ceramic blanks 200, the top layer assembly 22 includes four raw ceramic blanks 200, and the intermediate layer assembly 23 includes two raw ceramic blanks 200.

Further, the emitting area 241 and the receiving area 242 are disposed opposite to each other in the left-right direction (X). Each of the emitting area 241 and the receiving area 242 is defined by the top layer connecting surface 221 and the intermediate layer assembly 23, and extends in the front-rear direction (Y). The rolling area 243 is formed between the emitting area 241 and the receiving area 242, and is defined by the top layer connecting surface 221, the intermediate layer assembly 23 and the bottom layer connecting surface 211. The rolling area 243 also extends in the front-rear direction (Y).

The bottom layer connecting surface 211 has a bottom groove 213 forming a bottom part of the rolling area 243 and defined by a horizontal wall 2131 extending in the left-right direction (X) and two inclined walls 2132 extending outwardly, inclinedly and upwardly from opposite front and rear ends of the horizontal wall 2131.

The top layer connecting surface 221 has a top groove 224 forming a top part of the rolling area 243 and extending in the front-rear direction (Y). The intermediate layer assembly 23 has a through hole 234 forming an intermediate part of the rolling area 243 and extending in the front-rear direction (Y).

Figure 7:
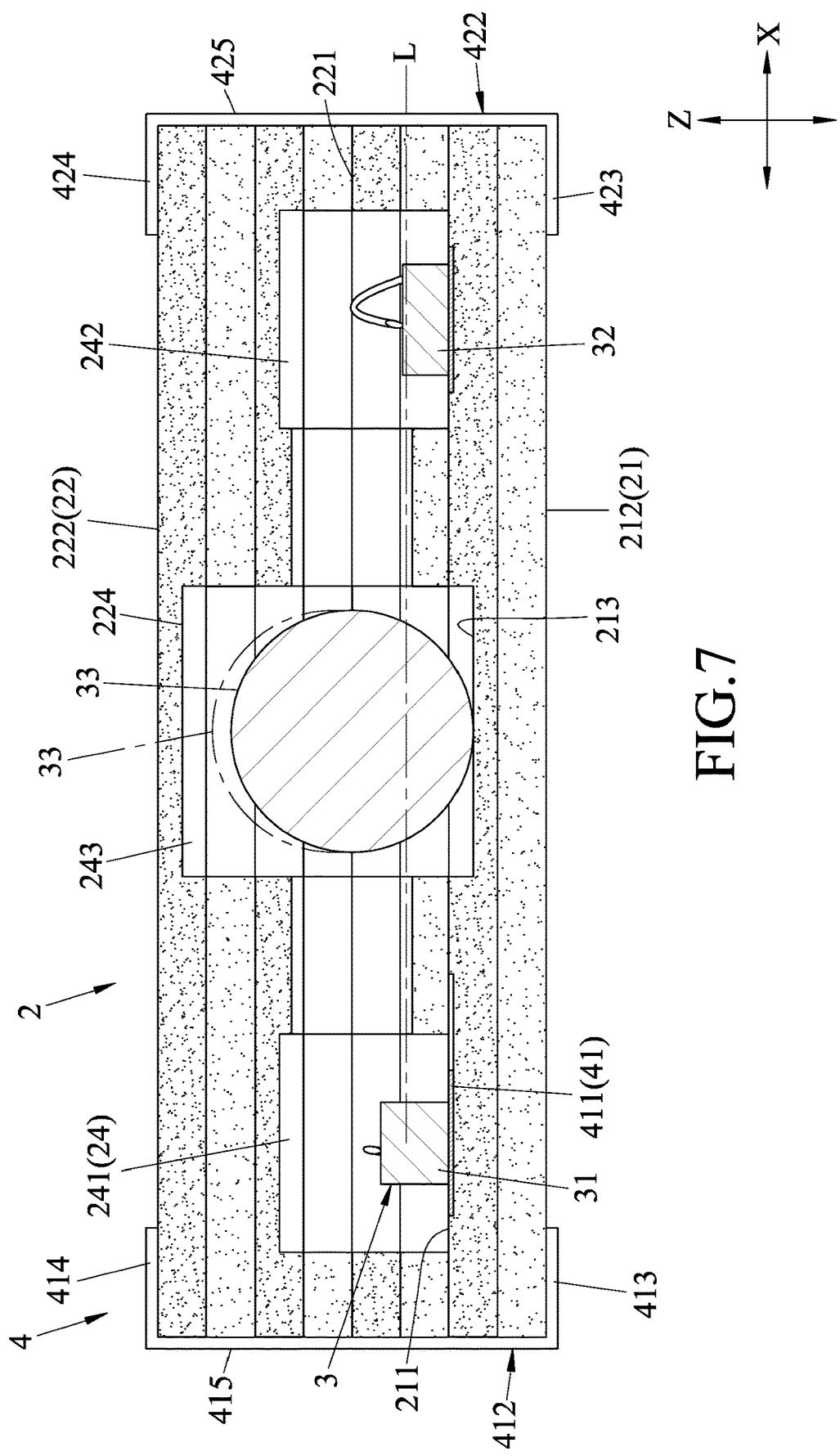
FIG. 7 is a sectional view of the second embodiment taken along line VII-VII of FIG. 5.
Figure 8:
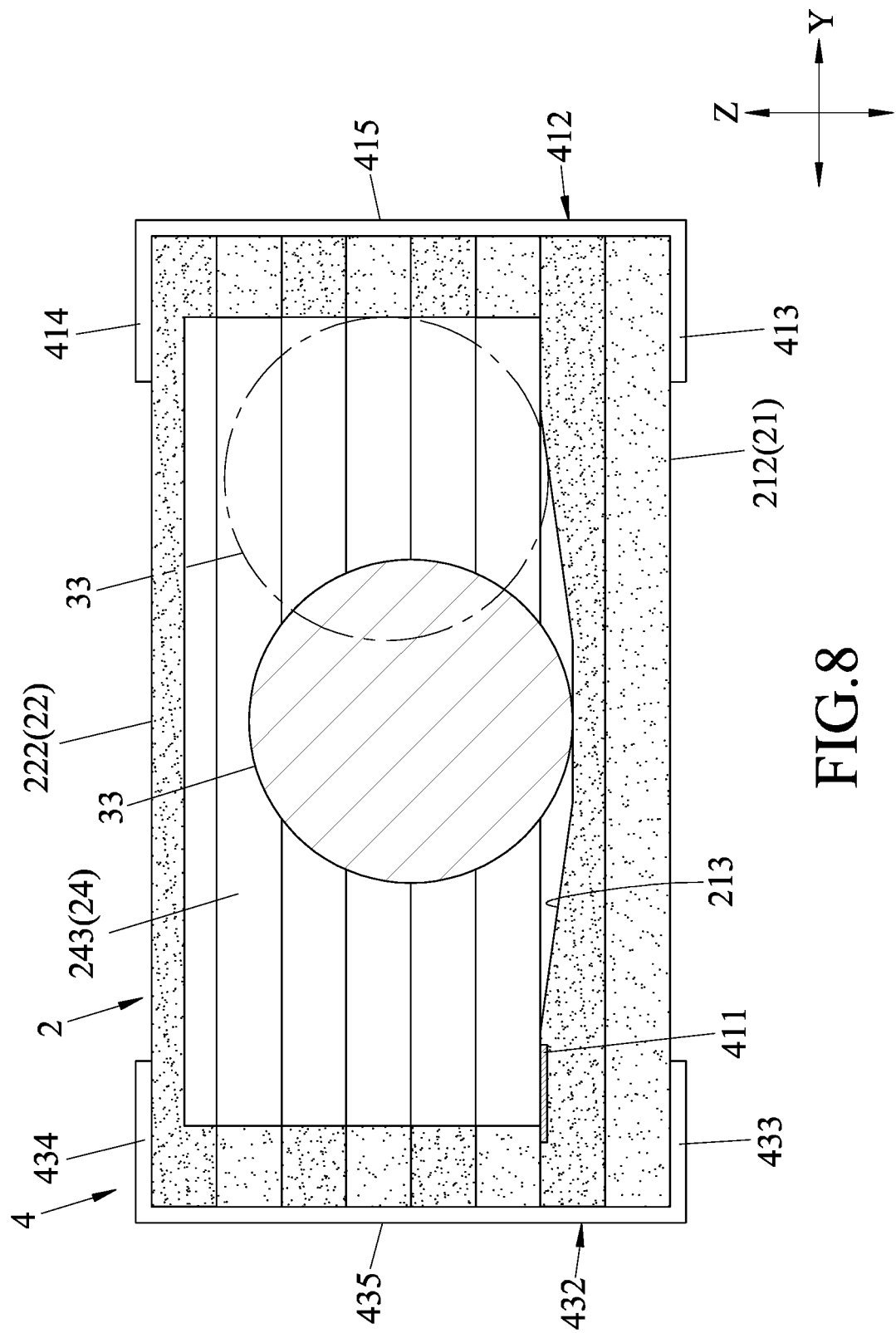
FIG. 8 is a sectional view of the second embodiment taken along line VIII-VIII of FIG. 5.

When the sensor switch 100' is tilted in the front-rear direction (Y), the rolling member 33 will roll by gravity within the rolling area 243 between the open circuit position, as shown in solid lines in FIGS. 7 and 8, and the closed circuit position, as shown in imaginary lines in FIGS. 7 and 8. When the sensor switch 100' is tilted in the left-right direction (X), the rolling member 33 will remain at a position corresponding to the emission axis (L) and block the light receiver 32 from receiving the light emitted from the light emitter 31. The sensor switch 100' can be used as a single directional angle switch.

In this embodiment, the power supply section 41 of the conducting unit 4 has only one power supply connecting portion 411 disposed on the bottom layer connecting surface 211 and connected simultaneously and electrically to the light emitter 31 and the light receiver 32.

The power supply conducting element 412 includes the first power supply conducting portion 413, the second power supply conducting portion 414, and the third power supply conducting portions 415. The third power supply conducting portions 415 contact and abut against an edge of the power supply connecting portion 411 that is exposed on the bottom layer outer surrounding surface 214.

The signal connecting portion 421 is disposed on the bottom layer connecting surface 211, and is wire bonded to the light receiver 32. The first signal conducting element 422 includes the first signal conducting portion 423, the second signal conducting portion 424, and the third signal conducting portions 425. The third signal conducting portions 425 contact and abut against an edge of the signal connecting portion 421 that is exposed on the bottom layer outer surrounding surface 214.

The first ground conducting element 432 includes the first ground conducting portion 433, the second ground conducting portion 434, and the third ground conducting portions 435. The third ground conducting portions 435 contact and abut against an edge of the ground connecting portion 431 that is exposed on the bottom layer outer surrounding surface 214.

To use the sensor switch 100', the circuit board 1 (see FIG. 3) may first be disposed on the first mounting surface 212 or the second mounting surface 222, after which the corresponding power supply conducting portion 413, 414, the corresponding signal conducting portion 423, 424, and the corresponding ground conducting portion 433, 434 are electrically connected to the circuit board 1.

The purpose and effect of the first embodiment can be similarly achieved using the second embodiment.

Figure 9:
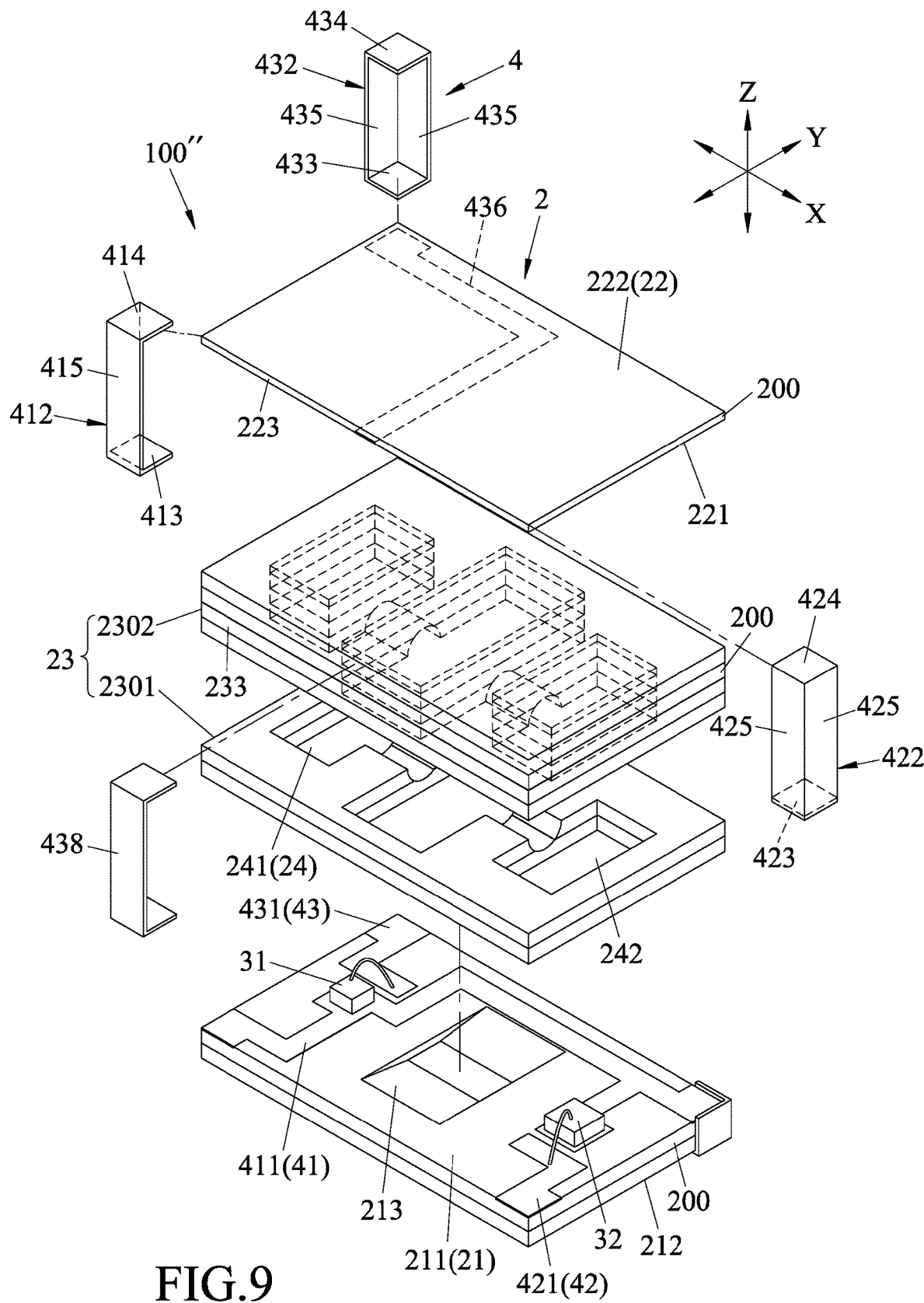
FIG. 9 is an exploded perspective view of a sensor switch according to the third embodiment of the present disclosure.

Referring to FIG. 9, the third embodiment of the sensor switch 100" according to this disclosure is shown to be similar to the second embodiment. However, in this embodiment, the top layer assembly 22 includes one raw ceramic blanks 200, and the intermediate layer assembly 23 includes a lower portion 2301 consisting of two raw ceramic blanks 200 and an upper portion 2302 consisting of four raw ceramic blanks 200.

Each of the emitting area 241 and the receiving area 242 is defined by the lower portion 2301 and the upper portion 2302 of the intermediate layer assembly 23. The rolling area 243 is defined by the lower and upper portions 2301, 2302 of the intermediate layer assembly 23 and the bottom layer connecting surface 211 of the bottom layer assembly 21.

The power supply connecting portion 411, the signal connecting portion 421 and the ground connecting portion 431 extend in directions different from the second embodiment.

The ground section 43 further has a ground extension area 436 disposed on the top layer connecting surface 221. The manufacturing process of the ground extension area 436 is similar to that of the ground connecting portion 431, so that a detailed description of the same is omitted herein.

The conducting unit 4 further includes a U-shaped ground conducting element 438 that is spaced apart from and disposed between the power supply conducting element 412 and the first signal conducting element 422. The U-shaped ground conducting element 438 has an intermediate portion disposed on and abutting against the third mounting surface 233 and further abutting against an edge of the ground extension area 436 exposed from the top layer outer surrounding surface 223.

Through the provision of the ground extension area 436, electric current can flow to the U-shaped ground conducting element 438. Further, through the presence of the third power supply conducting portion 415, the third signal conducting portion 425 and the U-shaped ground conducting element 438, when the sensor switch 100" is used, the circuit board 1 (see FIG. 3) may be disposed on the third mounting surface 233.

The purpose and effect of the second embodiment can be similarly achieved using the third embodiment.

Figure 10:
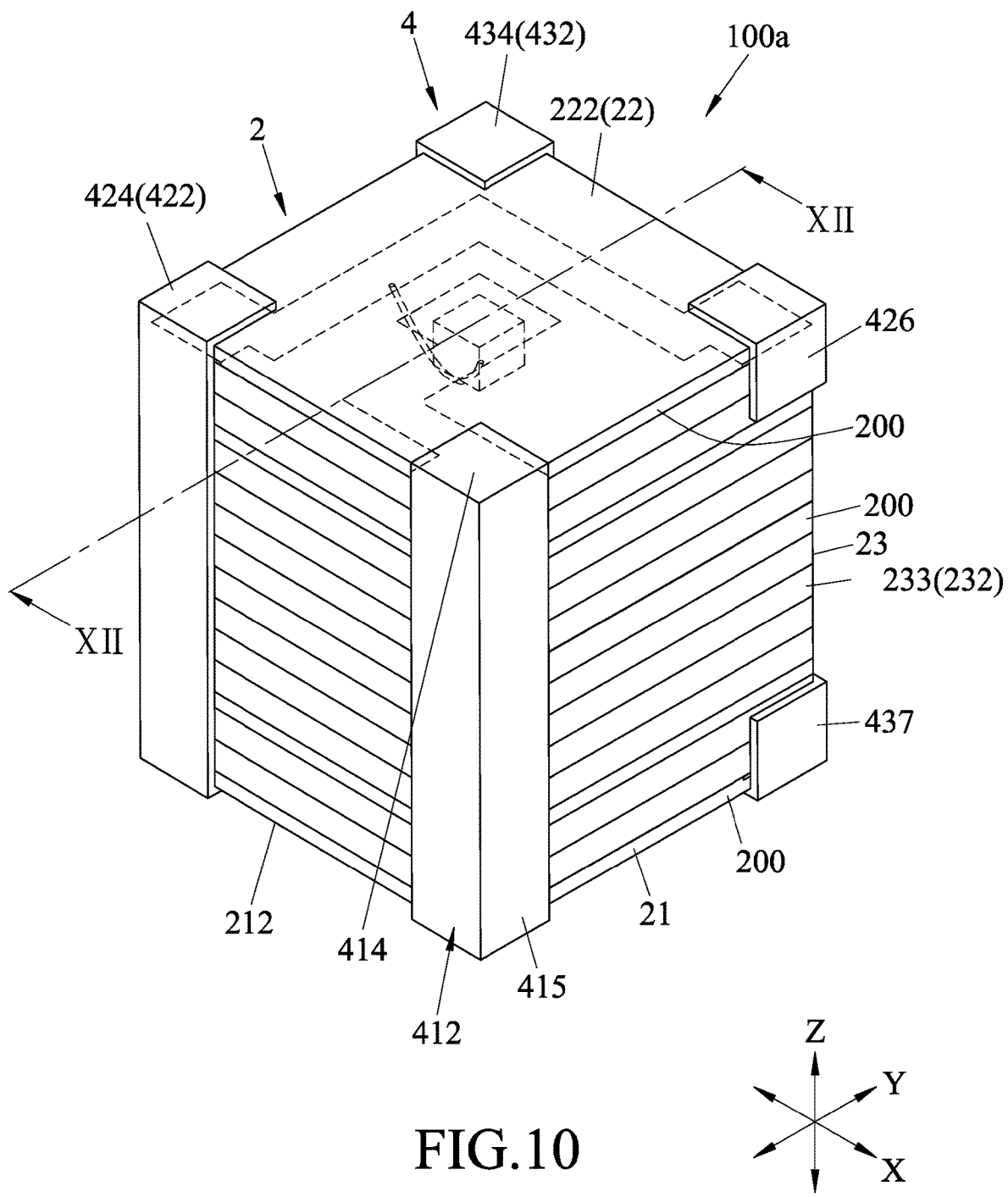
FIG. 10 is a perspective view of a sensor switch according to the fourth embodiment of the present disclosure.
Figure 11:
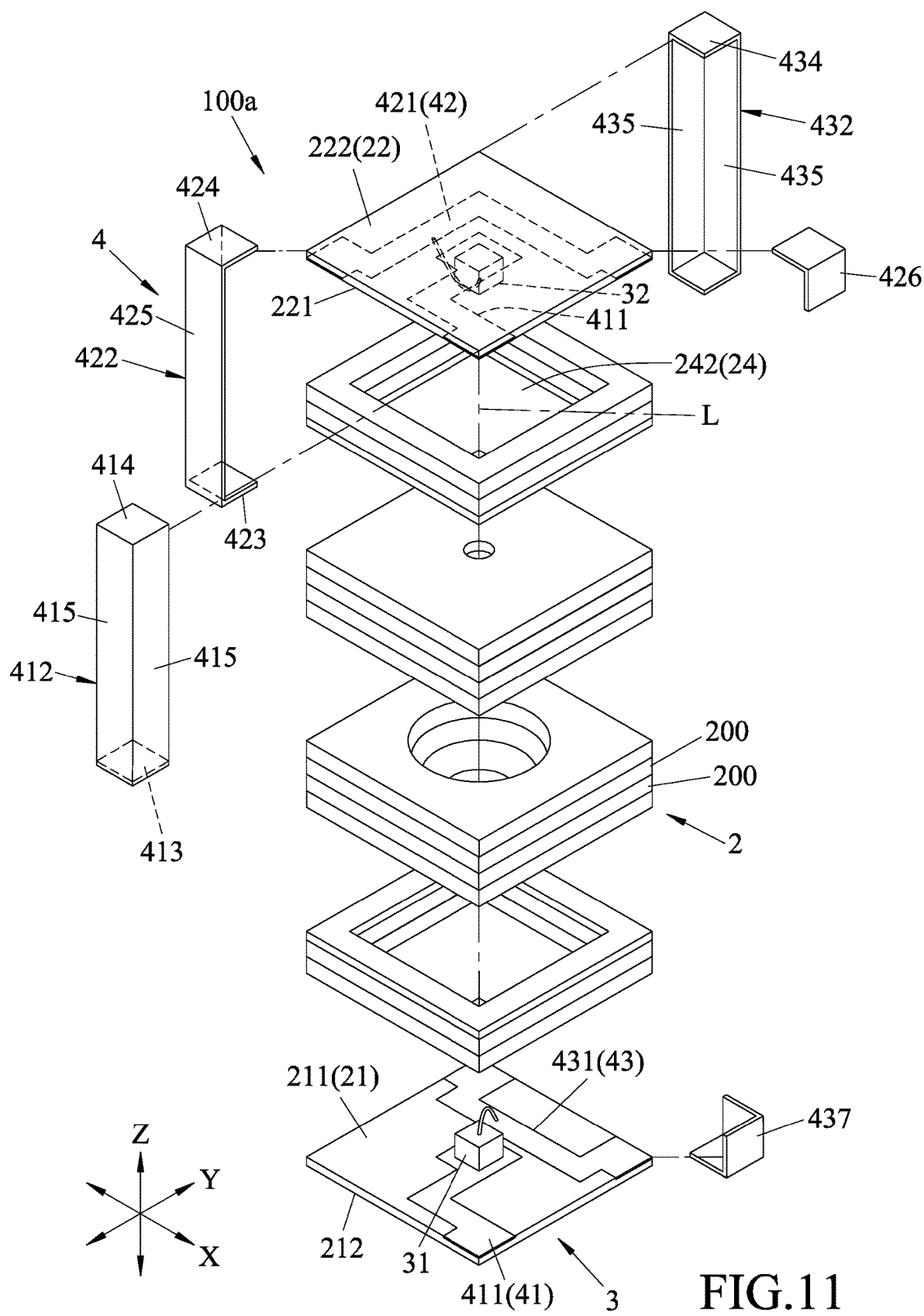
FIG. 11 is an exploded perspective view of the fourth embodiment.
Figure 12:
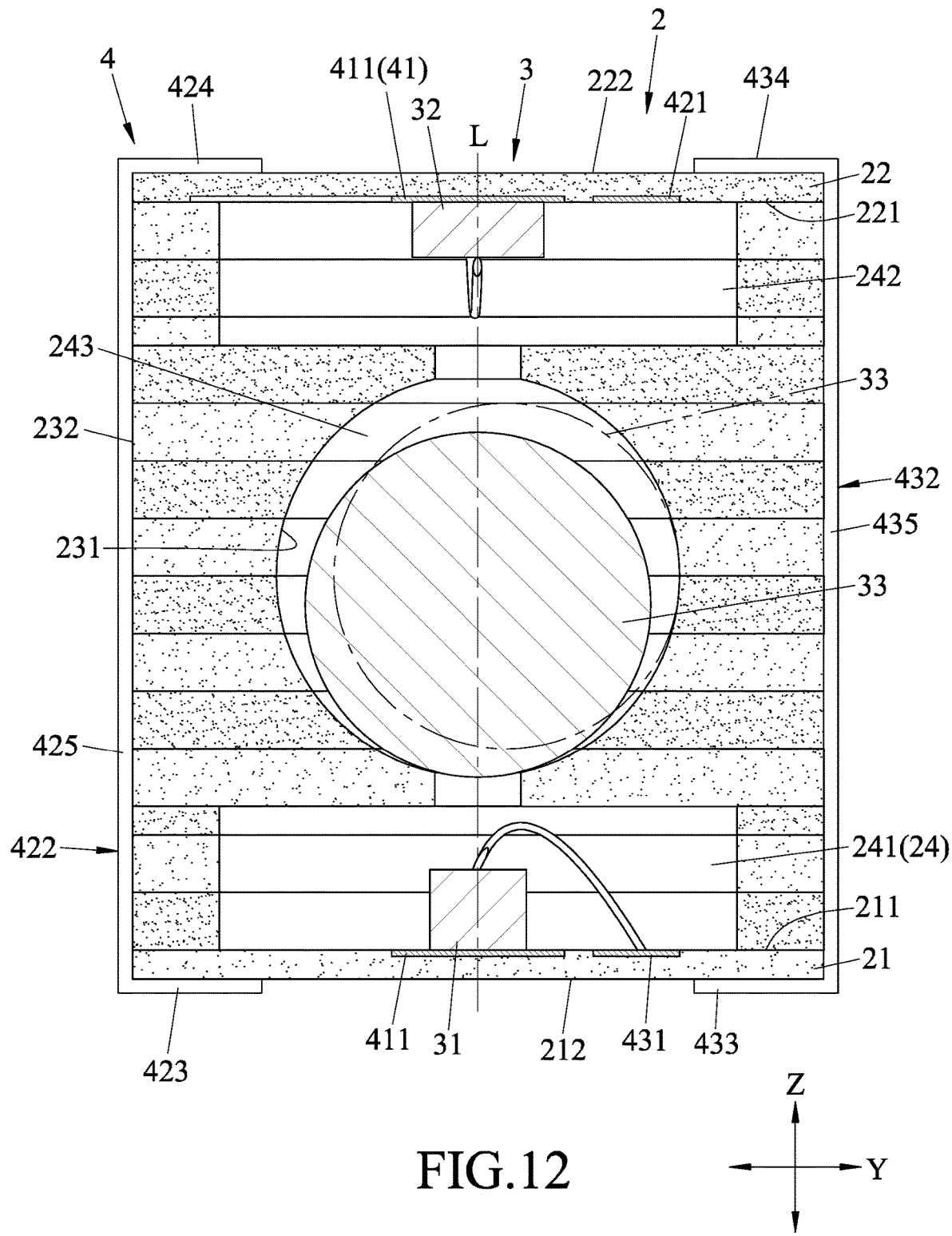
FIG. 12 is a sectional view of the fourth embodiment taken along line XII-XII of FIG. 10.

Referring to FIGS. 10 to 12, the fourth embodiment of the sensor switch (100a) according to this disclosure is shown to be similar to the first embodiment. However, in this embodiment, the intermediate layer assembly 23 includes fourteen raw ceramic blanks 200, the rolling area 243 has a spherical shape and a diameter larger than that of the rolling member 33, and the rolling member 33 is made of a light-transmitting material. When the sensor switch (100a) vibrates or tilts due to an external force, the rolling member 33 is rolled by gravity between a first position and a second position. When the rolling member 33 is in the first position, the sensor switch (100a) is horizontal, and the rolling member 33 is located at a position corresponding to the emission axis (L), as shown in solid line in FIG. 12. When the sensor switch (100a) is vibrated or tilted, the rolling member 33 will roll by gravity from the first position to the second position, as shown in imaginary line in FIG. 12, and is offset from the emission axis (L) so as to change the amount of reflected light and the amount of light received by the light receiver 32, thereby changing the signal generated by the light receiver 32. The sensor switch (100a) can be used as a vibration switch.

The purpose and effect of the first embodiment can be similarly achieved using the fourth embodiment.

Figure 13:
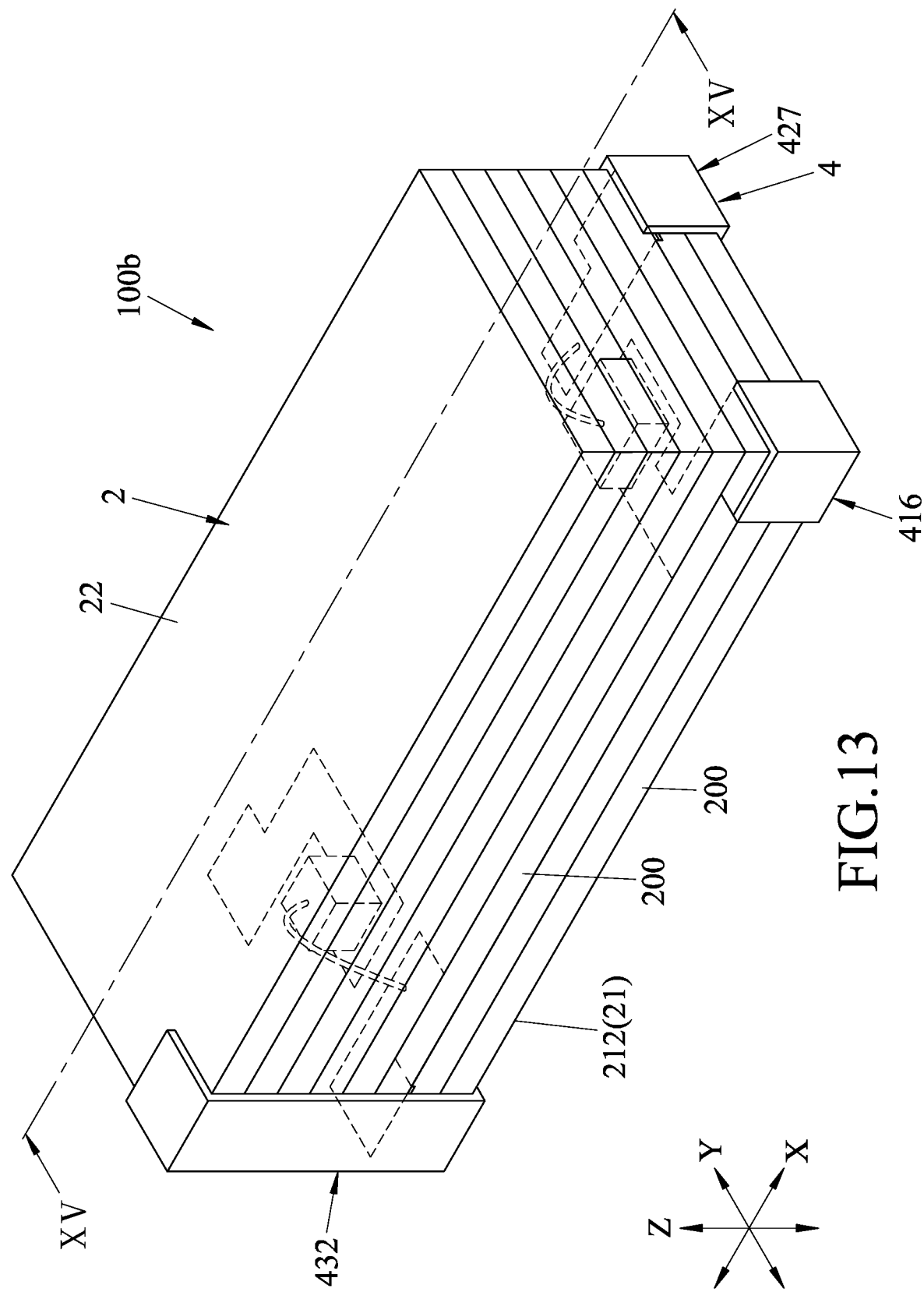
FIG. 13 is a perspective view of a sensor switch according to the fifth embodiment of the present disclosure.
Figure 14:
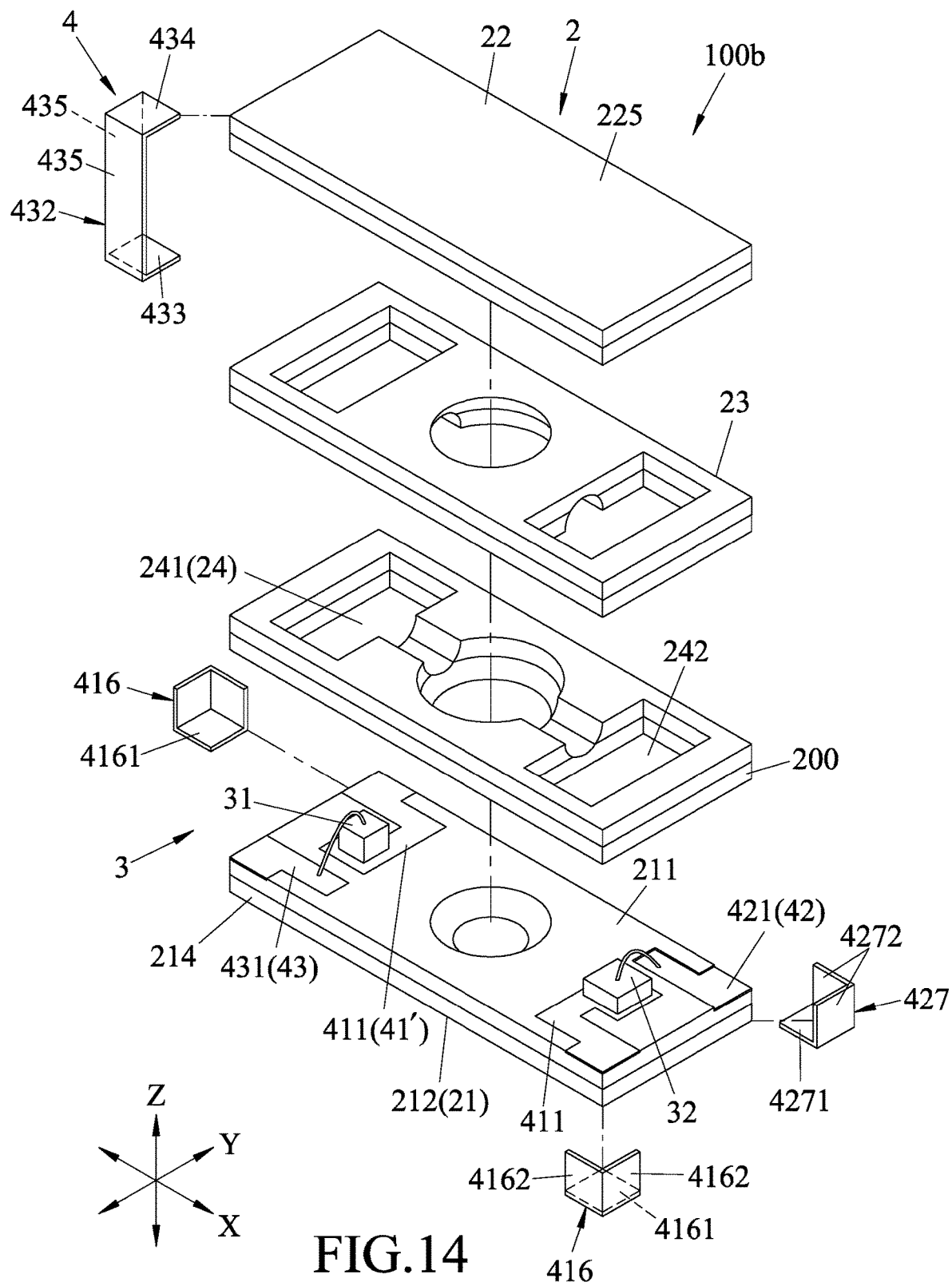
FIG. 14 is an exploded perspective view of the fifth embodiment.
Figure 15:
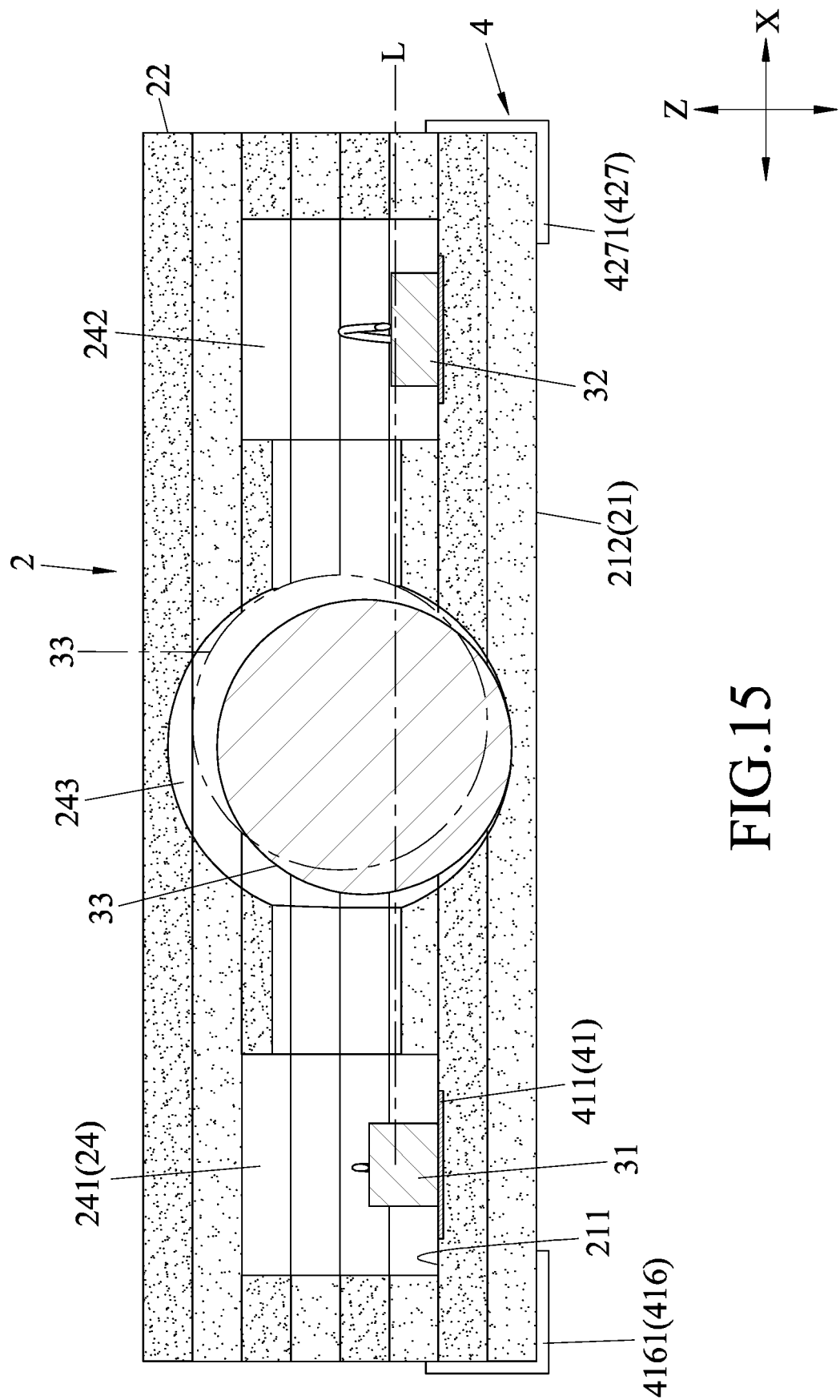
FIG. 15 is a sectional view of the fourth embodiment taken along line XV-XV of FIG. 13.
Figure 16:
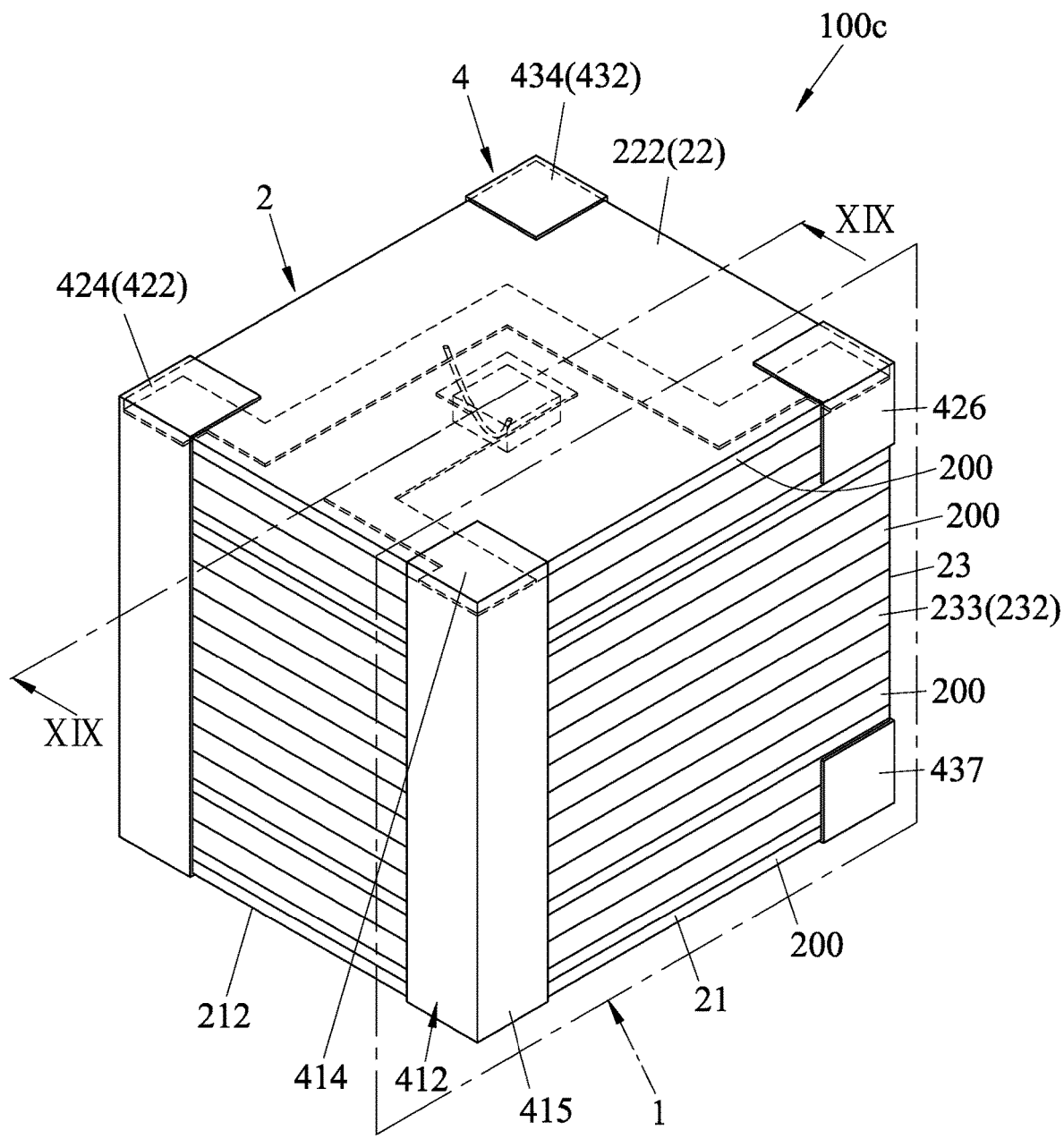
FIG. 16 is a perspective view of a sensor switch according to the sixth embodiment of the present disclosure.
Figure 17:
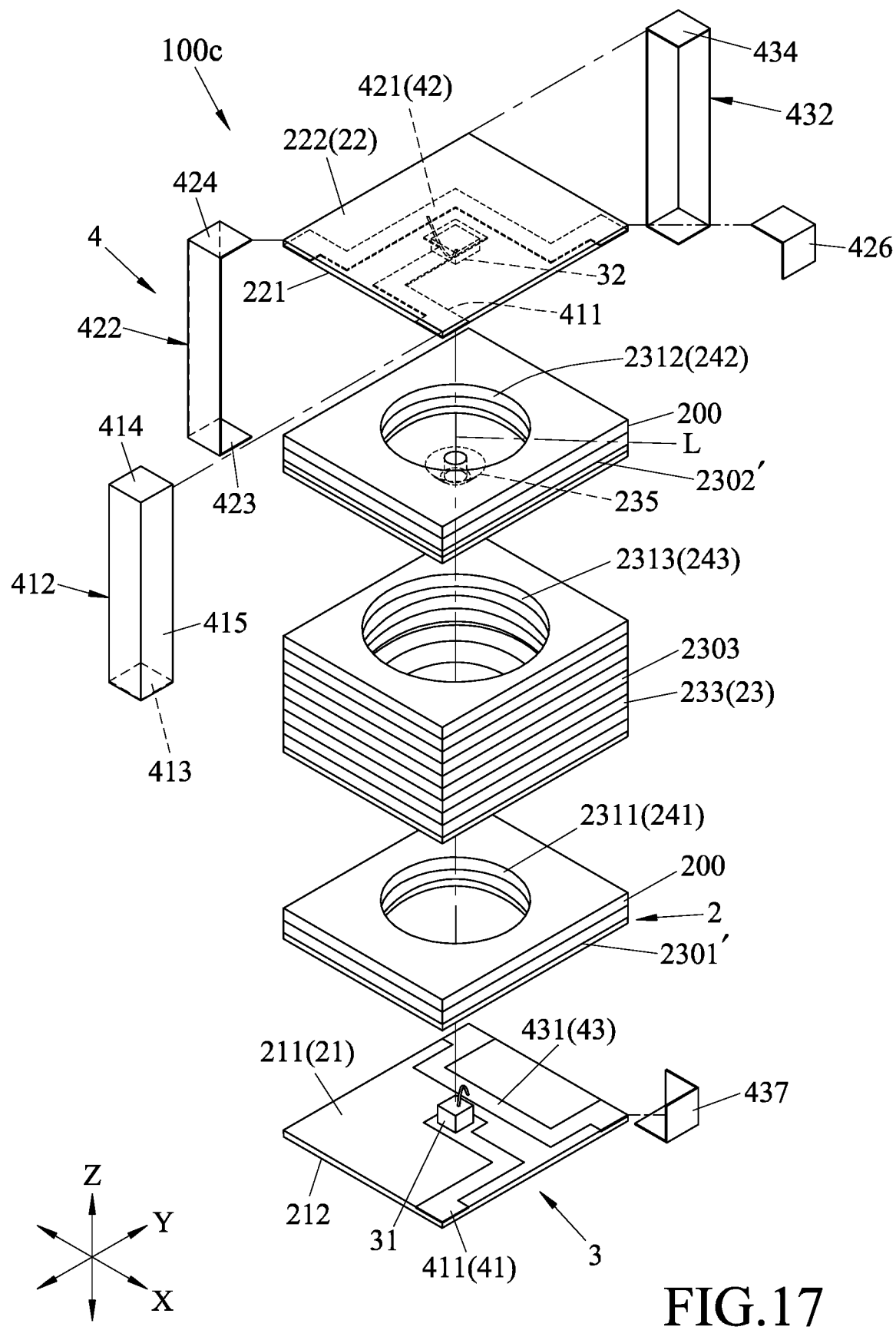
FIG. 17 is an exploded perspective view of the sixth embodiment.
Figure 18:
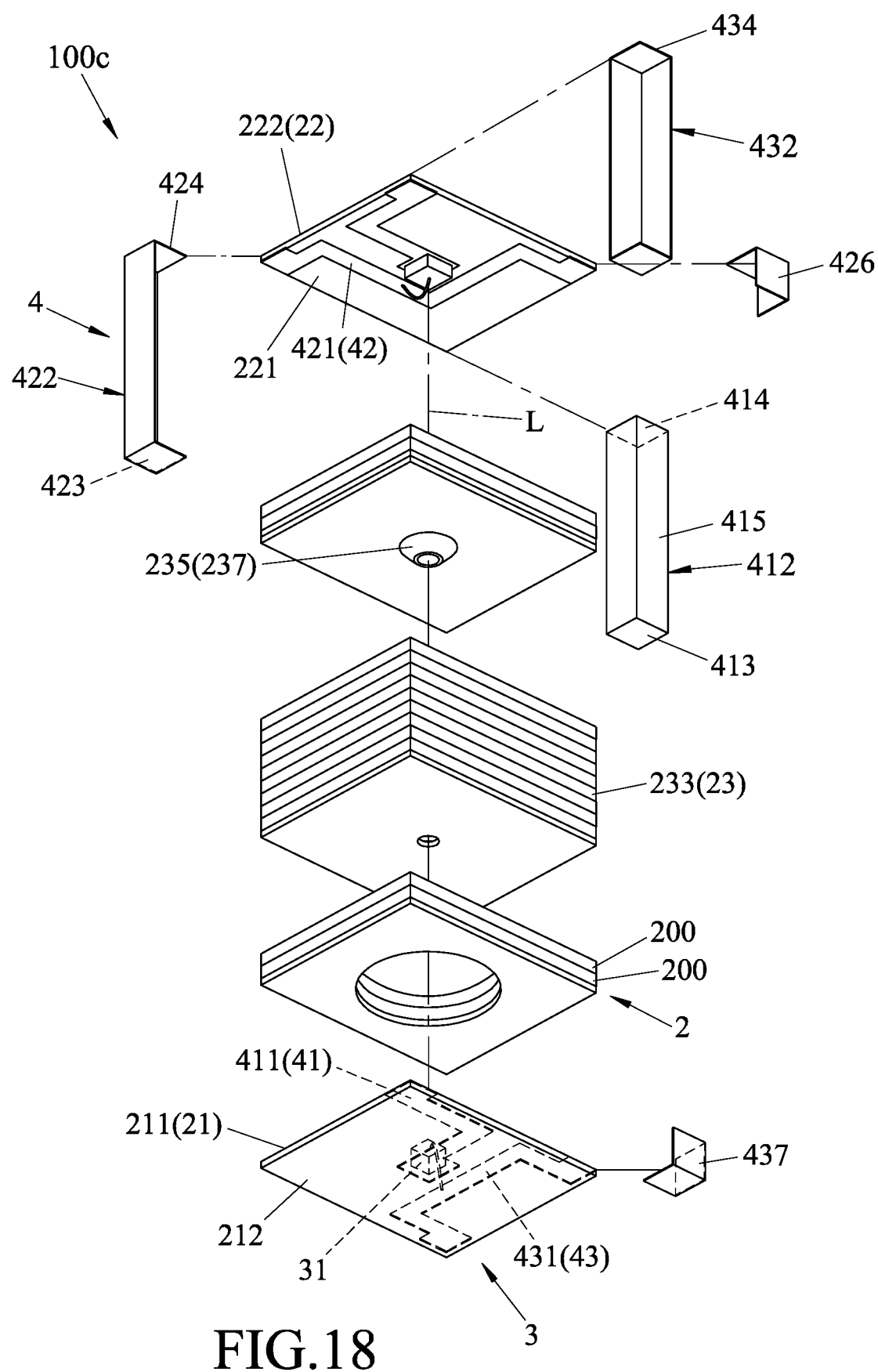
FIG. 18 is another exploded perspective view of the sixth embodiment, but taken from another angle.

Referring to FIGS. 13 to 15, the fifth embodiment of the sensor switch (100b) according to this disclosure is shown to be similar to the second embodiment. However, in this embodiment, the top layer assembly 22 includes two raw ceramic blanks 200, and the intermediate layer assembly 23 includes four raw ceramic blanks 200. Further, the rolling area 243 has a spherical shape and a diameter larger than that of the rolling member 33, and the rolling member 33 is made of a light-transmitting material.

The conducting unit 4 includes a power supply section 41', two power supply conducting elements 416, the signal section 42, a signal conducting element 427, the ground section 43, and the first ground conducting element 432.

The power supply section 41' has two power supply connecting portions 411 that are oppositely disposed on the bottom layer connecting surface 211 and that are connected electrically and respectively to the light emitter 31 and the light receiver 32.

Each power supply conducting element 416 has a first power supply conducting portion 4161 disposed on and abutting against the first mounting surface 212, and two side portions 4162 perpendicularly connected to each other and having bottom ends respectively connected to two adjacent lateral ends of the power supply conducting portion 4161 such that each power supply conducting element 416 has a cubic shape. The side portions 4162 of each power supply conducting element 416 contact and abut against an edge of a corresponding one of the power supply connecting portions 411 exposed from the bottom layer outer surrounding surface 214. The power supply conducting elements 416 are disposed diagonally spaced apart from each other on the bottom layer assembly 21.

The signal section 42 similarly has the signal connecting portion 421 disposed on the bottom layer connecting surface 211 and wire bonded to the light receiver 32.

The signal conducting element 427 has a structure similar to that of each power supply conducting element 416, and has a signal conducting portion 4271 disposed on and abutting against the first mounting surface 212, and two side portions 4272 perpendicularly connected to each other and having bottom ends respectively connected to two adjacent lateral ends of the signal conducting portion 4271 such that the signal conducting element 427 has a cubic shape. The side portions 4272 contact and abut against an edge of the signal connecting portion 421 exposed from the bottom layer outer surrounding surface 214. The signal conducting element 427 is disposed between the power supply conducting elements 416.

The ground section 43 similarly has the ground connecting portion 431 disposed on the bottom layer connecting surface 211 and wire bonded to the light emitter 31.

The first ground conducting element 432 similarly includes the first ground conducting portion 433 disposed on the first mounting surface 212, the second ground conducting portion 434 disposed on a top layer outer surface 225 of the top layer assembly 22, and the two third ground conducting portions 435 perpendicularly connected to each other. The third ground conducting portions 435 contact and abut against an edge of the ground connecting portion 431 exposed from the bottom layer outer surrounding surface 214. The first ground conducting element 432 is disposed between the power supply conducting elements 416, and is diagonally spaced apart from the signal conducting element 427.

To use the sensor switch (100b), the circuit board 1 (see FIG. 3) is first disposed on the first mounting surface 212, after which the power supply conducting portions 4161, the signal conducting portion 4271, and the first ground conducting portion 433 are electrically connected to the circuit board 1. When the sensor switch (100b) vibrates or tilts due to an external force, the rolling member 33 is rolled by gravity between a first position and a second position. When the rolling member 33 is in the first position, the sensor switch (100b) is horizontal, and the rolling member 33 is located at a position corresponding to the emission axis (L), as shown in solid line in FIG. 15. When the sensor switch (100b) is vibrated or tilted, the rolling member 33 will roll by gravity from the first position to the second position, as shown in imaginary line in FIG. 15, and is offset from the emission axis (L) so as to change the amount of reflected light and the amount of light received by the light receiver 32, thereby changing the signal generated by the light receiver 32.

The purpose and effect of the second embodiment can be similarly achieved using the fifth embodiment.

Referring to FIGS. 16 to 19, the sixth embodiment of the sensor switch (100c) according to this disclosure is shown to be similar to the first embodiment. However, in this embodiment, the intermediate layer assembly 23 includes seventeen raw ceramic blanks 200, and is divided into three portions: a lower portion 2301' consisting of three raw ceramic blanks 200, an upper portion 2302' consisting of four raw ceramic blanks 200, and a middle portion 2303 consisting of ten raw ceramic blanks 200. The lower portion 2301' has a lower inner wall surface 2311 defining the emitting area 241 of the receiving space 24. The upper portion 2302' has an upper inner wall surface 2312 defining the receiving area 242 of the receiving space 24. The middle portion 2303 has a middle inner wall surface 2313 defining the rolling area 243 of the receiving space 24.

The intermediate layer assembly 23 further has a hollow protrusion 235 protruding from a central portion of the upper portion 2301' toward the receiving space 24. The hollow protrusion 235 has an outer surface 237.

The middle inner wall surface 2313 has a lower section (2313a), an upper section (2313b) opposite to the lower section (2313a) in the top-bottom direction (Z), and an abutment section (2313d) connected between the outer surface of the hollow protrusion 235 and a top periphery of the upper section (2313b). The upper section (2313b) has a hole diameter larger than that of the lower section (2313a). The rolling member 33 has a diameter larger than that of the lower section (2313a) but smaller than that of the upper section (2313b).

Figure 19:
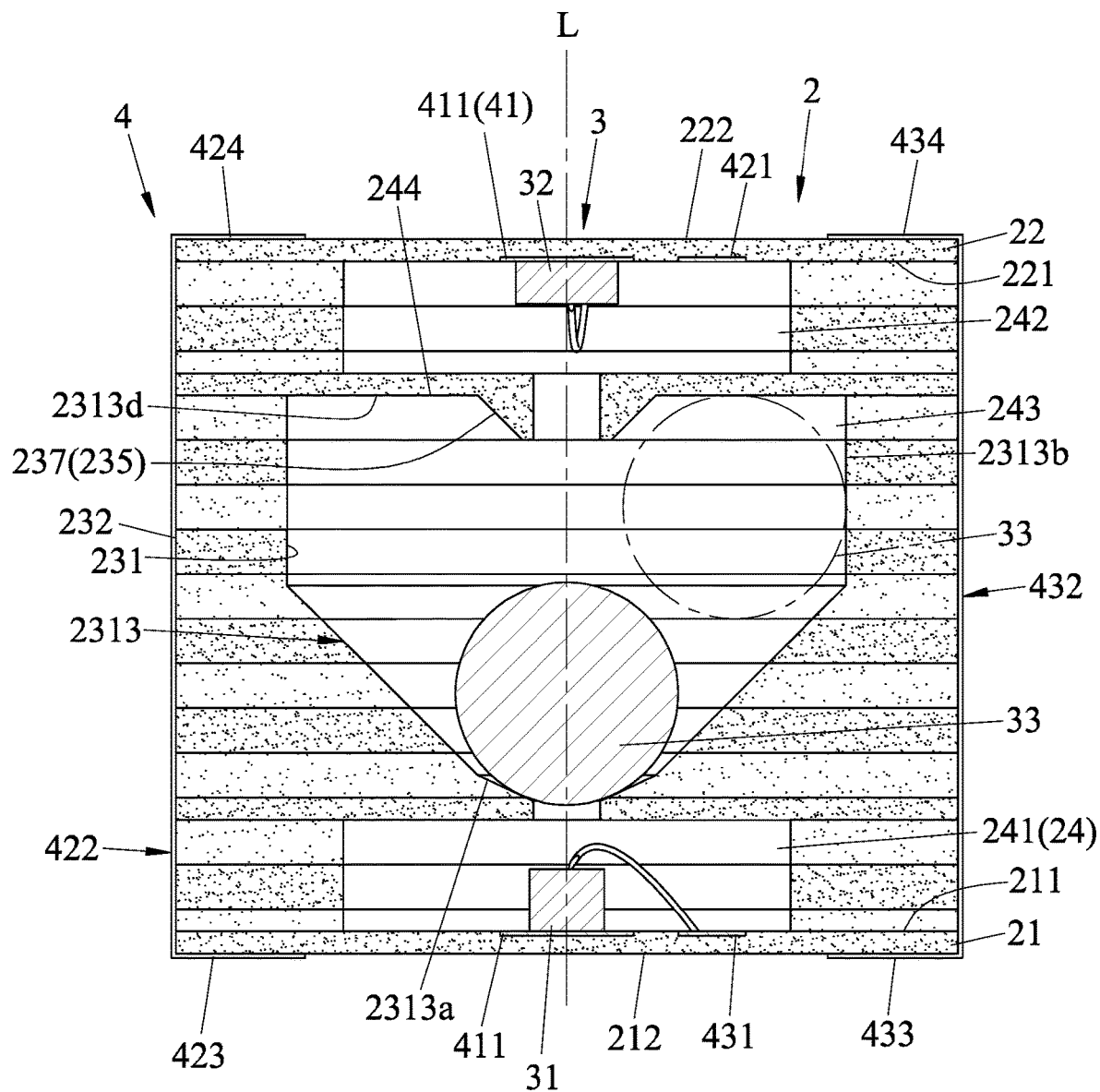
FIG. 19 is a sectional view of the sixth embodiment taken along line XIX-XIX of FIG. 16.

When the rolling member 33 is in the open circuit position, as shown in solid line in FIG. 19, the rolling member 33 is located on the lower section (2313a). When the rolling member 33 is in the closed circuit position, as shown in imaginary line in FIG. 19, the rolling member 33 is located in the upper section (2313b).

It should be noted herein that, when the rolling member 33 rolls toward the upper section (2313b), the rolling member 33 is prevented by the outer surface of the hollow protrusion 235 to roll toward the emission axis (L), so that the rolling member 33 is located between the abutment surface (2313d) and the upper section (2313b), and the sensor switch (100c) is placed in the closed circuit position. Further, when the sensor switch (100c) is turned 180 degrees upside down and at rest, the outer surface of the hollow protrusion 235 will guide the rolling member 33 to move away from the emission axis (L) so as to prevent the rolling member 33 from staying at a position corresponding to the emission axis (L) and blocking the light emitted from the light emitter 31, thereby maintaining the sensor switch (100c) in the closed circuit position.

The purpose and effect of the first embodiment can be similarly achieved using the sixth embodiment.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A sensor switch for connection with a circuit board, comprising:

a base unit made from a plurality of raw ceramic blanks that are sintered after being stacked, said base unit including a bottom layer assembly, a top layer assembly opposite to said bottom layer assembly in a top-bottom direction, and an intermediate layer assembly connected between said bottom layer assembly and said top layer assembly and cooperating with said bottom layer assembly and said top layer assembly to define a receiving space, one of said bottom layer assembly, said top layer assembly, and said intermediate layer assembly having a first mounting surface located on an outer side thereof and distal to said receiving space;

a sensor unit disposed in said receiving space and including a light emitter configured to emit light, a light receiver configured to receive the light emitted from said light emitter and then to generate a signal, and a rolling member located between said light emitter and said light receiver for changing the amount of light received by said light receiver; and a conducting unit made of metal and disposed on said base unit, said conducting unit including a power supply section, a power supply conducting element, a signal section, and a first signal conducting element, said power supply section being electrically connected to said light emitter and said light receiver, said power supply conducting element including a first power supply conducting portion disposed on and abutting against said first mounting surface, said signal section being capable of transmitting the signal sent from said light receiver to the circuit board, said first signal conducting element including a first signal conducting portion disposed on and abutting against said first mounting surface and spaced apart from said first power supply conducting portion.

2. The sensor switch as claimed in claim 1, wherein the other one of said bottom layer assembly, said top layer assembly, and said intermediate layer assembly has a second mounting surface located on an outer side thereof and distal to said receiving space, said power supply conducting element further including a second power supply conducting portion disposed on and abutting against said second mounting surface, said first signal conducting element further including a second signal conducting portion disposed on and abutting against said second mounting surface and spaced apart from said second power supply conducting portion.

3. The sensor switch as claimed in claim 2, wherein said conducting unit further includes a ground section connected to said light emitter, and a first ground conducting element, said first ground conducting element including a first ground conducting portion disposed on and abutting against said first mounting surface, and a second ground conducting portion disposed on and abutting against said second mounting surface.

4. The sensor switch as claimed in claim 3, wherein another one of said bottom layer assembly, said top layer assembly, and said intermediate layer assembly has a third mounting surface located on an outer side thereof and distal to said receiving space, said power supply conducting element further including at least one third power supply conducting portion disposed on and abutting against said third mounting surface.

5. The sensor switch as claimed in claim 4, wherein said conducting unit further includes a second signal conducting element spaced apart from said power supply conducting element and having at least one side portion disposed on and abutting against said third mounting surface.

6. The sensor switch as claimed in claim 5, wherein said conducting unit further includes a second ground conducting element having at least one side portion disposed on and abutting against said third mounting surface, said second ground conducting element being spaced apart from said power supply conducting element in a front-rear direction transverse to the top-bottom direction, and being spaced apart from said second signal conducting element in the top-bottom direction.

7. The sensor switch as claimed in claim 4, wherein said first signal conducting element further includes at least one third signal conducting portion disposed on and abutting against said third mounting surface and spaced apart from said at least one third power supply conducting portion.

8. The sensor switch as claimed in claim 7, wherein said conducting unit further includes a U-shaped ground conducting element disposed between said power supply conducting element and said first signal conducting element and having an intermediate portion disposed on and abutting against said third mounting surface.

9. The sensor switch as claimed in claim 1, wherein said receiving space has an emitting area, a receiving area opposite to said emitting area, and a rolling area disposed between and communicating with said emitting area and said receiving area, said light emitter being disposed in said emitting area, said light receiver being disposed in said receiving area, said rolling member being rollably disposed in said rolling area.

10. The sensor switch as claimed in claim 9, wherein said rolling area has a conical shape that tapers in a top to bottom direction, said light emitter being configured to emit the light in an emission axis, said light emitter and said light receiver being opposite to each other in the emission axis, said rolling member being made of an opaque material and being rollable between an open circuit position, in which said rolling member is at a position corresponding to the emission axis and blocks said light receiver from receiving the light emitted from said light emitter, and a closed circuit position, in which said rolling member deviates from the emission axis to permit said light receiver to receive the light emitted from said light emitter.

11. The sensor switch as claimed in claim 9, wherein said rolling area has a spherical shape and a diameter larger than that of said rolling member, said rolling member being made of a light-transmitting material, said light emitter being configured to emit the light in an emission axis, said light emitter and said light receiver being opposite to each other in the emission axis, said rolling member being rollable between a first position, in which said rolling member is at a position corresponding to the emission axis, and a second position, in which said rolling member is offset from the emission axis.

12. The sensor switch as claimed in claim 1, wherein said bottom layer assembly has a bottom layer connecting surface connected to a bottom side of said intermediate layer assembly, said top layer assembly has a top layer connecting surface connected to a top side of said intermediate layer assembly, said power supply section having at least one power supply connecting portion made of metal and disposed on one of said bottom layer connecting surface and said top layer connecting surface, said signal section having a signal connecting portion made of metal and disposed on one of said bottom layer connecting surface and said top layer connecting surface.

13. The sensor switch as claimed in claim 12, wherein said bottom layer connecting surface is connected to said bottom side of said intermediate layer assembly using an adhesive material, and said top layer connecting surface is connected to said top side of said intermediate layer assembly using an adhesive material.

14. The sensor switch as claimed in claim 10, wherein said intermediate layer assembly has a hollow protrusion located within said receiving space and capable of maintaining said rolling member at the closed circuit position when said sensor switch is turned upside down and at rest.

15. The sensor switch as claimed in claim 14, wherein said intermediate layer assembly includes a lower portion having a lower inner wall surface that defines said emitting area, an upper portion having an upper inner wall surface that defines said receiving area, and a middle portion having a middle inner wall surface that defines said rolling area, said hollow protrusion being disposed on said upper portion, said middle inner wall surface having a lower section, and an upper section opposite to said lower section in the top-bottom direction, said upper section having a hole diameter larger than that of said lower section, said rolling member having a diameter larger than that of said lower section but smaller than that of said upper section, said hollow protrusion protruding from said upper portion toward said receiving space.

* * * * *